US011527630B2

(12) United States Patent
Chang et al.

(10) Patent No.: US 11,527,630 B2
(45) Date of Patent: Dec. 13, 2022

(54) SEMICONDUCTOR DEVICE AND METHOD FOR FABRICATING THE SAME

(71) Applicant: TAIWAN SEMICONDUCTOR MANUFACTURING CO., LTD., Hsinchu (TW)

(72) Inventors: Kuo-Pin Chang, Hsinchu County (TW); Chien-Hung Liu, Hsinchu County (TW); Chih-Wei Hung, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 24 days.

(21) Appl. No.: 16/911,068

(22) Filed: Jun. 24, 2020

(65) Prior Publication Data

US 2021/0408253 A1    Dec. 30, 2021

(51) Int. Cl.
*H01L 29/423* (2006.01)
*H01L 29/788* (2006.01)
*H01L 27/11524* (2017.01)
*H01L 21/28* (2006.01)
*H01L 27/11556* (2017.01)

(52) U.S. Cl.
CPC .. *H01L 29/42328* (2013.01); *H01L 27/11524* (2013.01); *H01L 27/11556* (2013.01); *H01L 29/40114* (2019.08)

(58) Field of Classification Search
CPC ......... H01L 29/42328; H01L 27/11524; H01L 27/11556; H01L 29/40114; H01L 27/11521; H01L 27/11519; H01L 29/7889
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,431,595 B1* | 10/2019 | Yang ................. H01L 27/11573 |
| 10,854,627 B1* | 12/2020 | Moriyama .......... H01L 29/7827 |
| 2013/0100741 A1* | 4/2013 | Choi ........................ G11C 5/06 257/E21.422 |
| 2013/0119452 A1* | 5/2013 | Endoh ............... H01L 29/42328 438/257 |

(Continued)

*Primary Examiner* — Shahed Ahmed
*Assistant Examiner* — Khatib A Rahman
(74) *Attorney, Agent, or Firm* — Birch, Stewart, Kolasch & Birch, LLP

(57) ABSTRACT

A method for fabricating a semiconductor device is provided. The method includes depositing a first dielectric layer over a substrate; depositing a sacrificial layer over the first dielectric layer; depositing a second dielectric layer over the sacrificial layer; depositing an erase gate electrode layer over the second dielectric layer; etching a memory hole in the erase gate electrode layer, the sacrificial layer, and the first and second dielectric layers; and forming a semiconductor layer in the memory hole.

20 Claims, 35 Drawing Sheets

(56) References Cited

U.S. PATENT DOCUMENTS

| | | | |
|---|---|---|---|
| 2015/0179660 A1* | 6/2015 | Yada | H01L 27/11556 257/314 |
| 2015/0380418 A1* | 12/2015 | Zhang | H01L 27/11582 257/326 |
| 2016/0013200 A1* | 1/2016 | Yamashita | H01L 27/11565 257/316 |
| 2016/0181265 A1* | 6/2016 | Regnier | H01L 29/42324 438/258 |
| 2018/0374869 A1* | 12/2018 | Kim | H01L 29/0847 |
| 2020/0168622 A1* | 5/2020 | Fukuzumi | H01L 27/11582 |
| 2021/0265380 A1* | 8/2021 | Obu | H01L 27/11548 |
| 2021/0375900 A1* | 12/2021 | Zhang | H01L 27/11526 |

* cited by examiner

SEMICONDUCTOR DEVICE AND METHOD FOR FABRICATING THE SAME

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

Flash technology has enabled designers to create cost effective and high performance programmable SOC (system on chip) solutions through the use of split-gate flash memory cells. The aggressive scaling of memory cells enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
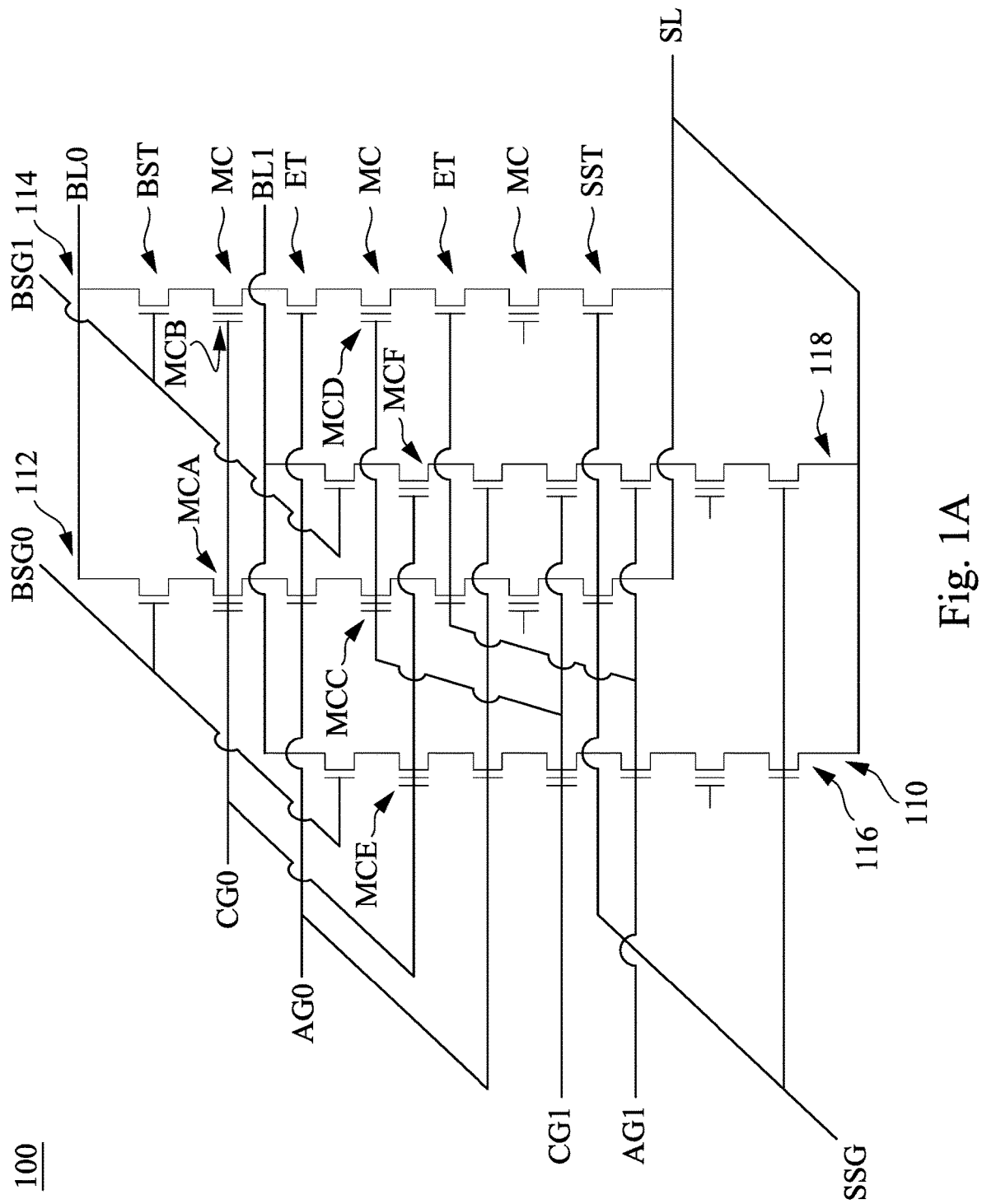
FIG. 1A illustrates a circuit of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure are directed to three-dimensional (3D) non-volatile memory devices, such as vertical NAND memory strings and other three-dimensional devices, and methods of making the same, the various aspects of which are described below. The embodiments of the disclosure can be employed to form various semiconductor devices such as three-dimensional memory array devices including a plurality of NAND memory strings. For example, the NAND memory string may include pairs of vertical columns of memory cells which are formed alternating electrode layers and dielectric layers. The memory cells may be grouped in a sector and/or a block and all the cells within a sector or a block are erased simultaneously. For example, each sector or block in the array comprises many pairs of floating gates and control gates, and between two adjacent pairs of floating gates and control gates is an erase gate.

FIG. 1A illustrates a circuit of a semiconductor device 100 according to some embodiments of the present disclosure. The semiconductor device 100 may include plural memory strings 110 arranged in an array. Each memory string 110 may include a bit selection transistor BST and a source selection transistor SST at the edges of the string, and any desired number of memory cells MC connected in string between the bit selection transistor BST and the source selection transistor SST.

In some embodiments, the drain of the bit selection transistor BST is connected to one of bit lines (e.g., the bit lines BL0-BL1), and the gate of the bit selection transistor BST is connected to one of bit select gate lines (e.g., the bit select gate lines BSG0-BSG1). In some embodiments, the sources of the source selection transistors SST of the strings 110 are electrically connected to a source lines SL, and the gates of the source selection transistors SST of the strings 110 are electrically connected to a source select gate line SSG.

In some embodiments, the memory cells MC are transistors, each having a control gate connected to one of control gate lines (e.g., the control gate lines CG0-CG1), which may also be referred to as word lines in some embodiments. In some embodiments, each memory string 110 may include an erase gate transistor ET between adjacent memory cells MC, and the gate of the erase gate transistor ET is connected to one of erase gate lines (e.g., the erase gate lines AG0-AG1).

In some embodiments of the present disclosure, the memory strings 110 (respectively labelled as 112-118 for better illustration) shares the source select gate line SSG and the source lines SL. In some embodiments, the memory strings 112 shares the bit line BL0 with memory strings 114, and the memory strings 116 shares the bit line BL1 with memory strings 118. In some embodiments, the memory strings 112 shares the bit select gate line BSG0 with memory strings 116, and the memory strings 114 shares the bit select gate line BSG1 with memory strings 118. In some embodiments, the memory cells MC of the memory strings 112-118 at the same level share the same control gate line (e.g., one of the control gate lines CG0-CG1), and the erase gate transistor ET of the memory strings 112-118 at the same level share the same erase gate line (e.g., one of the erase gate lines AG0-AG1).

Through the configuration, by providing suitable signals to the bit select gate lines (e.g., the bit select gate lines BSG0-BSG1), the control gate lines (e.g., the control gate lines CG0-CG1), the bit lines (e.g., the bit lines BL0-BL1), and the erase gate lines (e.g., the erase gate lines AG0-AG1), one or more of the memory cells MC may be selected for programming, reading, and erasing operation. For illustrating the operations of the of the memory cells MC, some of the memory cells MC are labelled as memory cells MCA-MCF, in which the memory cell MCA is the memory cell selected for programming, reading, and erasing operation in the following description.

For example, for programing the memory cell MCA, an on-voltage is provided to the bit select gate line BSG0, while an off-voltage is provided to the bit select gate line BSG1. The bit selection transistor BST of the memory strings 112 and 116 may be turned on by the on-voltage, and the bit selection transistor BST of the memory strings 114 and 118 may be turned off by the off-voltage. In the present embodiments, the on-voltage is greater than the off-voltage. For example, the on-voltage is in a range from about 2.5 volts to about 8 volts, and the off-voltage is in a range from about −1 volts to about 0 volts. In some embodiments, a programing voltage is provided to the control gate line CG0, while a medium voltage is provided to the other control gate line CG1. In the present embodiments, the programing voltage is greater than the medium voltage. The medium voltage may be higher than the maximum threshold voltage of the memory cells MC, thereby turning on the unselected cell MCC in the string. For example, the programing voltage is in a range from about 10 volts to about 15 volts, and the medium voltage is in a range from about 4 volts to about 8 volts. In the present embodiments, a low voltage is provided to the erase gate line AG0, while a medium voltage is provided to the other erase gate line AG1, and the medium voltage is greater than the low voltage. The medium voltage provided to the erase gate line AG1 may be similar to the medium voltage provided to the control gate line CG1. For example, the medium voltage is in a range from about 4 volts to about 8 volts, and the low voltage is in a range from about 0.8 volts to about 1.6 volts. In some embodiments, the source select gate line SSG connected to all the strings 112-118 may be provided with an on-voltage, for example, in a range from about 2.5 volts to 8 about volts. In some embodiments the source line SL may be provided with a medium voltage for example, in a range from about 3 volts to 5 about volts. In the present embodiments, the bit line BL0 is provided with a programing current, while an inhibited voltage is provided to the bit line BL1. The inhibited voltage may be similar to the medium voltage provided to the source line SL. For example, the programing current is in a range from about 0.8 microamperes (μA) to about 2.5 μA, and the inhibited voltage is in a range from about 3 volts to 5 about volts. Through the configuration, the floating gate of the memory cell MCA may be negatively charged, the floating gates of other memory cells MC may not be negatively charged, and the resulting programmed state of the memory cell MCA is known as '0' state.

For example, for reading the memory cell MCA, the bit select gate line BSG0 is provided with the on-voltage (as used during programming operation), while the bit select gate line BSG1 is provided with the off-voltage (as used during programming operation). The bit selection transistor BST of the memory strings 112 and 116 may be turned on by the on-voltage, and the bit selection transistor BST of the memory strings 114 and 118 may be turned off by the off-voltage. In some embodiments, a reference voltage is provided to the control gate line CG0, while the other control gate line CG1 may be provided with the medium voltage as used in programming operation, thereby turning on the unselected cell MCC in the string. The reference voltage is sufficiently low to preserve the amount of charge in the floating gate, but high enough to distinguish between a charged and uncharged floating gate. To read a memory cell, the charge stored in the floating gate needs to be identified by measuring the threshold voltage of the cell. By applying the reference voltage at the control gate of the memory cell MCA and the voltage at which the cell starts conducting is measured to identify the threshold voltage. In the present embodiments, the reference voltage is lower than the medium voltage. For example, the reference voltage is in a range from about 0.8 volts to about 2.5 volts, and the medium voltage is in a range from about 4 volts to about 8 volts. In the present embodiments, the erase gate lines AG0 and AG1 are provided with a voltage in a range from about 2.5 volts to about 8 volts. In some embodiments, the source select gate line SSG connected to all the strings 112-118 may be provided with an on-voltage, for example, in a range from about 2.5 volts to about 8 volts. In some embodiments the source line SL may be provided with a low voltage for example, about 0 volt. In the present embodiments, the bit line BL0 is provided with a read bias ranging from about 0.3 volts to about 1.5 volts, while a bit line BL1 is provided to the low voltage as that of the source line SL. Through the selection of the bit select gate line BSG0 and the control gate line CG0, the state of the memory cell MCA may be read out through the bit line BL0. For example, depending on whether a read current is detected by the bit line BL0 or not, the state of the memory cell MCA is known as '1' state or '0' state.

For example, for erasing the memory cell MCA, the erase gate line AG0 is provided with an erase voltage, for example, in a range from about 6 volts to about 12 volts. In some embodiments, during erasing the memory cell MCA, the other erase gate line AG1 may also be provided with the erase voltage, and the memory cells MCB-MCF are also erased. In some embodiments, during the erase operation, the bit select gate line BSG0, the select gate line SSG, the control gate line CG0, the bit line BG0, and the source line SL may be grounded or provided with a low voltage, for example, in a range from about −1 volt to about 1 volt.

Figure 1B:
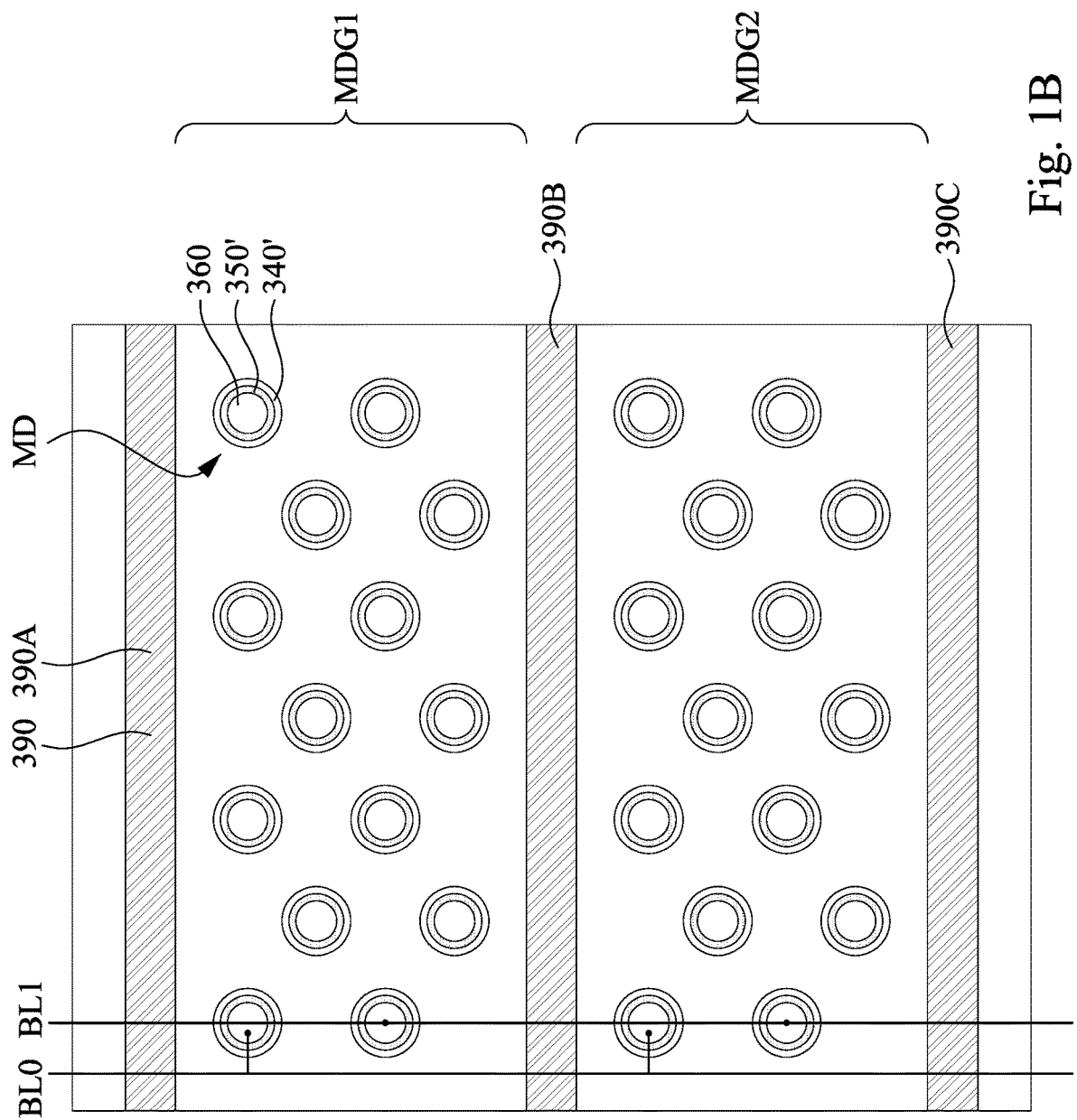
FIG. 1B is a schematic top view of a semiconductor device of FIG. 1A according to some embodiments of the present disclosure.
Figure 1C:
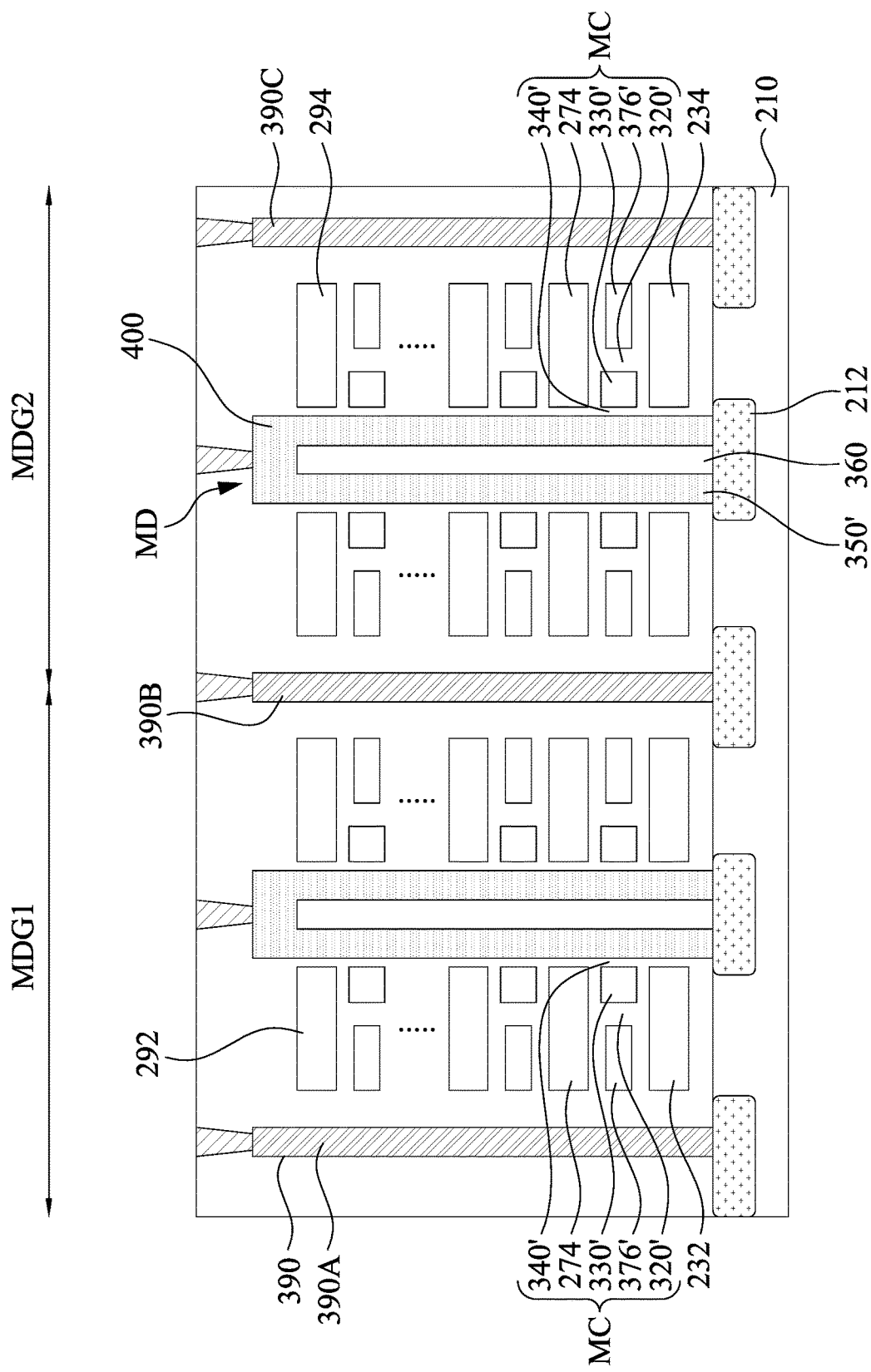
FIG. 1C is a schematic cross-sectional view of a semiconductor device of FIG. 1B.

FIG. 1B is a schematic top view of the semiconductor device 100 of FIG. 1A according to some embodiments of the present disclosure. FIG. 1C is a schematic cross-sectional view of the semiconductor device 100 of FIG. 1B. Reference is made to FIGS. 1B and 1C. Each of the memory strings 110 (e.g., the memory strings 112-118) in FIG. 1A may include the memory stack structures MD. Each of the memory stack structures MD includes a select gate electrode 232/234, a select gate electrode 292/294, plural memory cells MC between the select gate electrodes 232 and 292, and one or more erase gate electrode(s) 272/274. Each of the memory cells MC may include a portion of the semiconductor layer 350', a control gate electrode 376', and a floating gate electrode 330'. In the present embodiments, the semiconductor layer 350' is located between a source/drain region 212 and a conductive feature 400, and may wrap around a dielectric core 360. The memory cells MC may further include a tunneling layer 340' between the semiconductor layer 350' and the floating gate electrode 330', a blocking layer 320' between the control gate stack 370 and the floating gate electrode 330'. In the present embodiment, the select gate electrode 232/234 may be the gate electrode of the source selection transistor SST in FIG. 1A, the select gate electrode 292/294 may be the gate electrode of the bit selection transistor BST in FIG. 1A, and an erase gate electrode 272/274 may be the erase gate electrode of the erase gate transistor ET in FIG. 1A.

In the present embodiments, the memory stack structures MD between adjacent source conductive features 390 are grouped as the group MDG1/MDG2, and the memory stack structures MD of the same group MDG1/MDG2 may share the same control gate electrodes 376', the same erase gate electrode(s) 272/274, the same select gate electrode 232/234, and the same select gate electrode 292/294. For better illustration, the source conductive features 390 respectively are labelled as the source conductive features 390A-390C, which may be electrically connected to the same source line SL in FIG. 1A through suitable electrical interconnect. For example, the memory stack structures MD between the source conductive features 390A and 390B (i.e., the group MDG1) share the same control gate electrodes 376', the same erase gate electrode(s) 272, the same select gate electrode 232, and the same select gate electrode 292. On the other hand, the memory stack structures MD between the source conductive features 390B and 390C (i.e., the group MDG2) share another control gate electrodes 376', another erase gate electrode(s) 274, another select gate electrode 234, and another select gate electrode 294, which are separated from the electrodes 376', 272, 232, and 292 between the source conductive features 390A and 390B by the configuration of the source conductive feature 390B.

In the present embodiments, the select gate electrode 292 between the source conductive features 390A and 390B may be electrically connected to the bit select gate line BSG0 through back-end of line (BEOL) electrical interconnect, and the select gate electrode 294 between the source conductive features 390B and 390C may be electrically connected to the bit select gate line BSG1 through the BEOL electrical interconnect. Through the configuration, a group of the memory stack structures MD between the source conductive features 390A and 390B and a group of the memory stack structures MD between the source conductive features 390B and 390C may be respectively selected by the bit select gate line BSG0-BSG1.

In the present embodiments, the erase gate electrode(s) 272 between the source conductive features 390A and 390B and the erase gate electrode(s) 274 between the source conductive features 390B and 390C at the same level may be electrically connected to one of the erase gate lines (e.g., one of the erase gate lines AG0-AG1) through suitable BEOL electrical interconnect. In other word, the erase gate electrodes 272 and 274 at the same level are electrically connected to each other and controlled by one erase gate line.

In the present embodiments, the select gate electrode 232 between the source conductive features 390A and 390B and the select gate electrode 234 between the source conductive features 390B and 390C may be electrically connected to the select gate line SSG through suitable BEOL electrical interconnect. In other word, the select gate electrode 232 and 234 are electrically connected to each other and controlled by the same select gate line SSG.

In the present embodiments, each of the control gate electrodes 376' between the source conductive features 390A and 390B and each of the control gate electrode 376' between the source conductive features 390B and 390C may be electrically connected to one of the control gate lines (e.g., the control gate line CG0 or CG1) through suitable BEOL electrical interconnect. In other word, the control gate electrodes 376' at the same level are electrically connected to each other and controlled by one of the control gate lines (e.g., the control gate line CG0), and the control gate electrodes 376' at the another same level are electrically connected to each other and controlled by another one of the control gate lines (e.g., the control gate line CG1).

FIGS. 2A-21B illustrate various stages in the fabrication process of a semiconductor device according to some embodiments of the present disclosure. The illustration is merely exemplary and is not intended to limit beyond what is specifically recited in the claims that follow. It is understood that additional steps may be provided before, during, and after the steps shown by FIGS. 2A-21B, and some of the steps described below can be replaced or eliminated for additional embodiments of the method. The order of the steps/processes may be interchangeable.

Figure 2A:
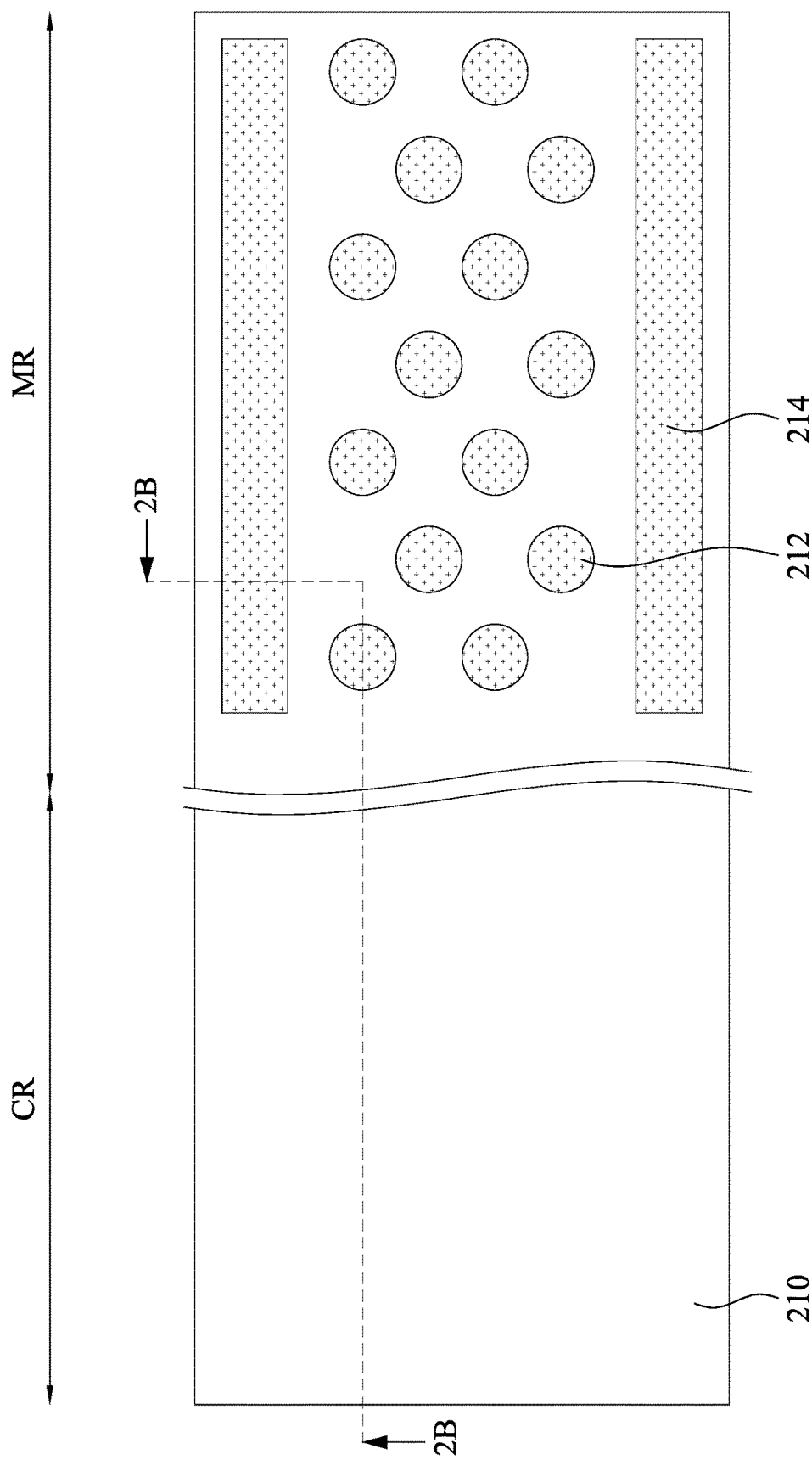
FIGS. 2A-22B illustrate various stages in the fabrication process of a semiconductor device according to some embodiments of the present disclosure.
Figure 2B:
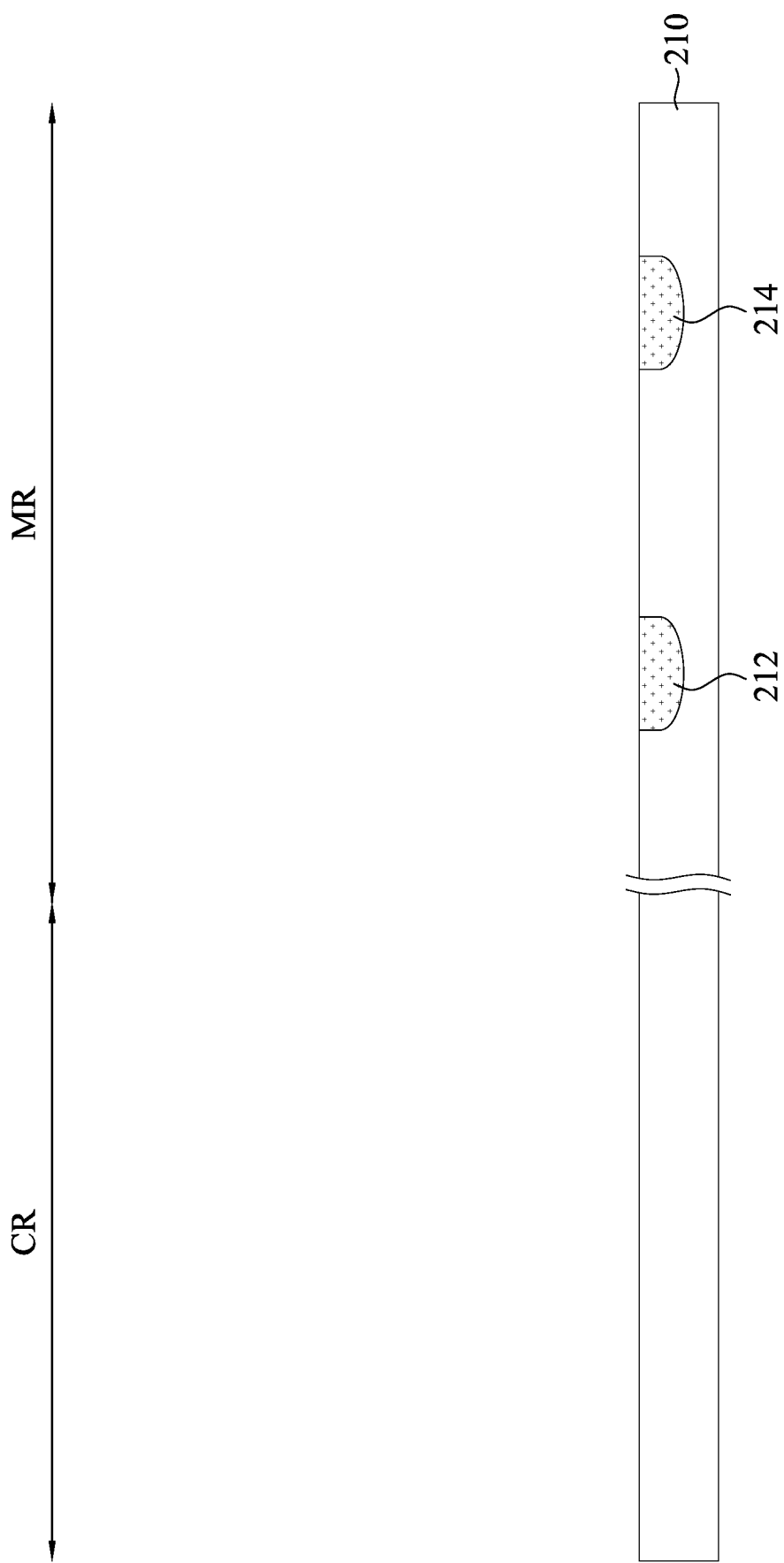

Referring to FIGS. 2A and 2B, FIG. 2B is a cross-sectional view taken along line 2B-2B of FIG. 2A. A substrate 210 is provided. In some embodiments, the substrate 210 can be a semiconductor substrate, such as a bulk silicon substrate, a germanium substrate, a compound semiconductor substrate, or other suitable substrate. The substrate 210 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 210 may be optionally doped with impurity ions such that it is lightly n-type or lightly p-type. In the present embodiments, the substrate 210 includes a memory region MR where memory devices are to be formed and a contact region CR where conductive contacts electrically connected to the electrodes of the memory devices to be formed. The contact region CR may be located at an edge of the memory region MR. In some embodiments, the substrate 210 may further include a peripheral region, and logic devices, HV circuits, Input/output (10) circuits, core circuits, SRAM circuits, and other circuits may be formed in the peripheral region.

Source/drain regions 212 and 214 are formed in the substrate 210 by suitable process, such as ion implantation and/or diffusion. For example, a patterned mask may be formed over the substrate 210 first, and then dopants are implanted to regions of the substrate 210 exposed by the implantation patterned mask, thereby forming the source/drain regions 212 and 214. Source/drain regions 212 and 214 may be p-type doped regions and/or n-type doped regions. The source/drain regions 212 and 214 may have dopant concentrations higher than about $10^{18}/cm^3$. In some embodiments, the source/drain regions 212 and 214 may doped regions of the same conductive type. The source/drain regions 212 and 214 may be formed be the same or different ion implantation processes. In some other embodiments, the source/drain regions 212 and 214 may be formed through epitaxy, and targets regions of the substrate 210 may be recessed for accommodating the epitaxial source/drain regions 212 and 214.

In some embodiments of the present disclosure, the source/drain regions 214 may be formed as plural lines, and the source/drain regions 212 are regions located between two adjacent lines. In some embodiments, the source/drain regions 212 may be formed in an array, thereby enlarging a number of the source/drain regions 212 between the two adjacent source/drain regions 214. For example, herein, first, third, fifth, and seventh columns of the source/drain regions 212 (e.g., from left to right) are at a position higher than second, fourth, sixth columns of the source/drain regions 212 (e.g., from left to right) as viewed from top as shown in FIG. 2A. Also, first and third rows of the source/drain regions 212 (e.g., from top to bottom) are alternatively aligned with second and fourth rows of the source/drain regions 212 (e.g., from top to bottom) as viewed from top as shown in FIG. 2A.

In the present embodiments, the width of the source/drain regions 212 (e.g., the diameter of the source/drain regions 212) are depicted as similar with the width of the source/drain regions 214. In some other embodiments, the width of the source/drain regions 212 (e.g., the diameter of the source/drain regions 212) may be greater than or less than the width of the source/drain regions 214.

Figure 3:
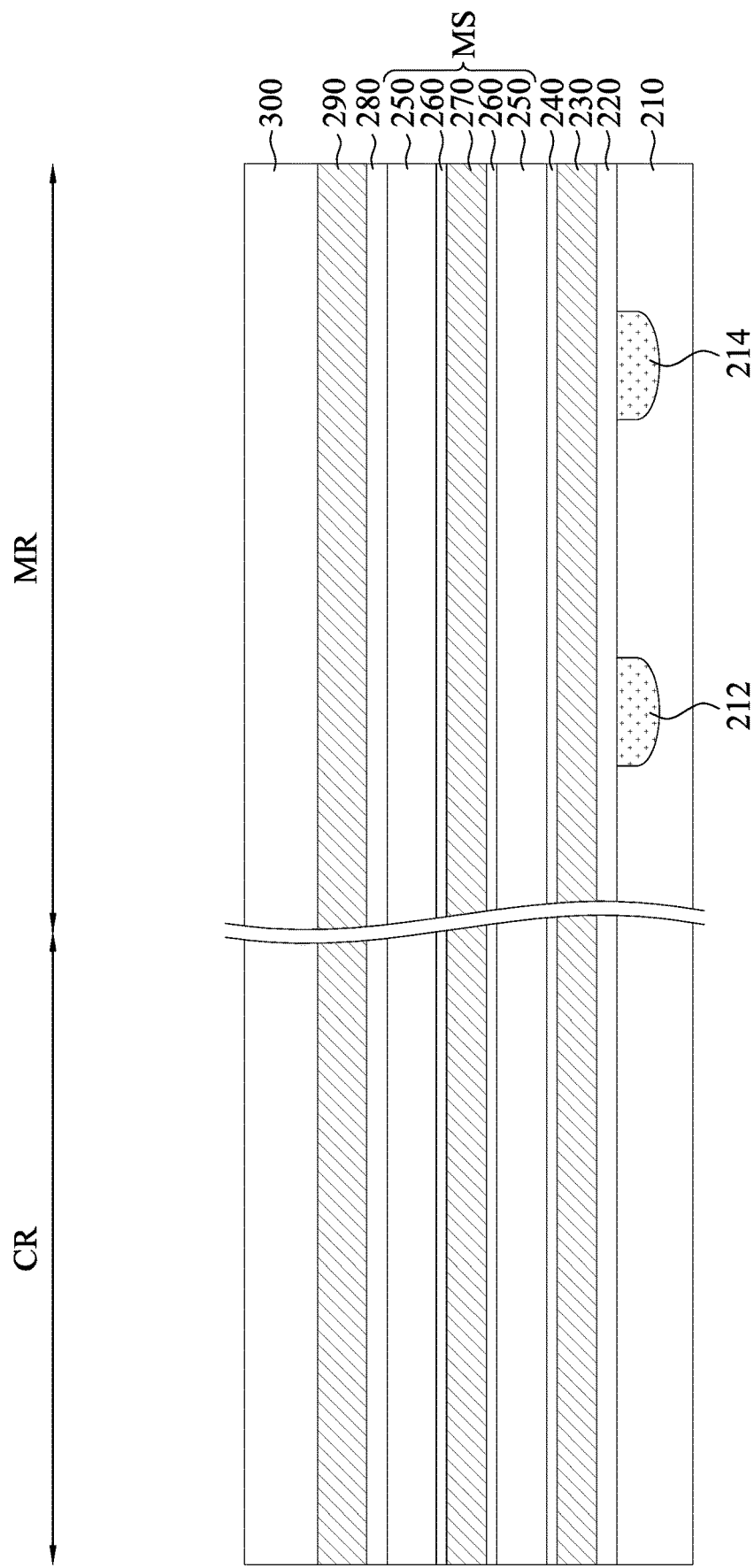

Referring to FIG. 3, where a dielectric layer 220, a first select gate electrode layer 230, a dielectric layer 240, a memory stacked layer MS of repeating layers 250-270, a dielectric layer 280, a second select gate electrode layer 290, and a dielectric cap layer 300 are deposited over substrate 210 in a sequence.

In some embodiments, the dielectric layer 220 may be made of a dielectric material, such as silicon oxide, or the like. The dielectric material may be deposited, for example, by chemical vapor deposition (CVD). For example, if silicon oxide is employed for the dielectric layer 220, tetraethyl orthosilicate (TEOS) can be employed as the precursor material for the CVD process.

In some embodiments, the first select gate electrode layer 230 is made of suitable conductive material, such as doped polysilicon or metal (e.g., AlCu, tungsten, or the like). The material of the first select gate electrode layer 230 may be deposited, for example, by chemical vapor deposition (CVD), or the like.

In some embodiments, the dielectric layer 240 may be made of a dielectric material, such as silicon oxide, or the like. The material of the dielectric layer 240 may be similar to that of the dielectric layer 220. The material of the dielectric layer 240 may be deposited, for example, by chemical vapor deposition (CVD). For example, if silicon oxide is employed for the dielectric layer 240, tetraethyl orthosilicate (TEOS) can be employed as the precursor material for the CVD process.

In some embodiments, the sacrificial layers 250 may be made of a dielectric material different from that of the dielectric layers 220 and 240. For example, the sacrificial layers 250 may be made of silicon nitride, or the like. The material of the sacrificial layers 250 can be formed, for example, CVD or atomic layer deposition (ALD).

In some embodiments, the dielectric layers 260 may be made of a dielectric material, such as silicon oxide, or the like. The material of the dielectric layer 260 may be different from that of the sacrificial layers 250. The material of the dielectric layer 260 may be similar to that of the dielectric layer 220 and/or 240. The material of the dielectric layers 260 may be deposited, for example, by chemical vapor deposition (CVD). For example, if silicon oxide is employed for the dielectric layers 260, tetraethyl orthosilicate (TEOS) can be employed as the precursor material for the CVD process. The thickness of the dielectric layers 260 may be in a range from about 60 angstroms to about 100 angstroms. If the thickness of the dielectric layers 260 is greater than 100 angstroms, the erasing operation may require a larger erase voltage bias; if the thickness of the dielectric layers 260 is less than 60 angstroms, isolation between erase gate and floating gate may have oxide break damage, which in turn may arise reliability issue.

In some embodiments, the erase gate electrode layer 270 is made of suitable conductive material, such as doped polysilicon or metal (e.g., AlCu, tungsten, or the like). The material of the erase gate electrode layer 270 may be the same as that of the first select gate electrode layer 230. The material of the erase gate electrode layer 270 may be deposited, for example, by chemical vapor deposition (CVD), atomic layer deposition (ALD), or the like. The erase gate electrode layer 270 may have a thickness in a range from about 100 angstroms to about 300 angstroms. If the thickness of the erase gate electrode layer 270 is greater than about 300 angstroms, it may unnecessarily induce etching issue; if the thickness of the erase gate electrode layer 270 is less than about 100 angstroms, it may induce short channel effect.

In the present embodiments, the memory stacked layer MS is illustrated as having two sacrificial layers 250 and an erase electrode layer 270 between the two sacrificial layers 250. The dielectric layers 260 may be located between the erase electrode layer 270 and adjacent one of the sacrificial layers 250, thereby spacing the erase electrode layer 270 from the sacrificial layers 250. In some further embodiments, the stack MS may have three or more sacrificial layers 250 and plural erase electrode layers 270, and each of the erase electrode layers 270 is intervening between adjacent two sacrificial layers 250. The dielectric layers 260 may be located between one of the erase electrode layers 270 and adjacent one of sacrificial layers 250, thereby spacing the erase electrode layers 270 from the sacrificial layers 250.

In some embodiments, the dielectric layer 280 is formed over the stacked layer MS. The material of the dielectric layer 280 may be different from that of the sacrificial layers 250. For example, the dielectric layer 280 may be made of a dielectric material, such as silicon oxide, or the like. The material of the dielectric layer 280 may be similar to that of the dielectric layers 220, 240, and/or 260. The material of the dielectric layer 280 may be deposited, for example, by chemical vapor deposition (CVD). For example, if silicon oxide is employed for the dielectric layers 280, tetraethyl orthosilicate (TEOS) can be employed as the precursor material for the CVD process.

In some embodiments, the second select gate electrode layer 290 is made of suitable conductive material, such as doped polysilicon or metal (e.g., AlCu, tungsten, or the like). The material of the second select gate electrode layer 290 may be the same as that of the first select gate electrode layer 230 and/or the erase gate electrode layer 270. The material of the second select gate electrode layer 290 may be deposited, for example, by chemical vapor deposition (CVD), atomic layer deposition (ALD), or the like.

In some embodiments, the dielectric cap layer 300 is formed over the second select gate electrode layer 290. The material of the dielectric cap layer 300 may be different from that of the sacrificial layers 250. For example, the dielectric cap layer 300 may be made of a dielectric material, such as silicon oxide, or the like. The material of the dielectric cap layer 300 may be similar to that of the dielectric layers 220, 240, 260, and/or 280. The dielectric cap layer 300 can have a greater thickness than each of the dielectric layers 220, 240, 260, and 280. The dielectric cap layer 300 can be deposited, for example, by chemical vapor deposition. For example, if silicon oxide is employed for the dielectric cap layer 300, tetraethyl orthosilicate (TEOS) can be employed as the precursor material for the CVD process.

Figure 4:
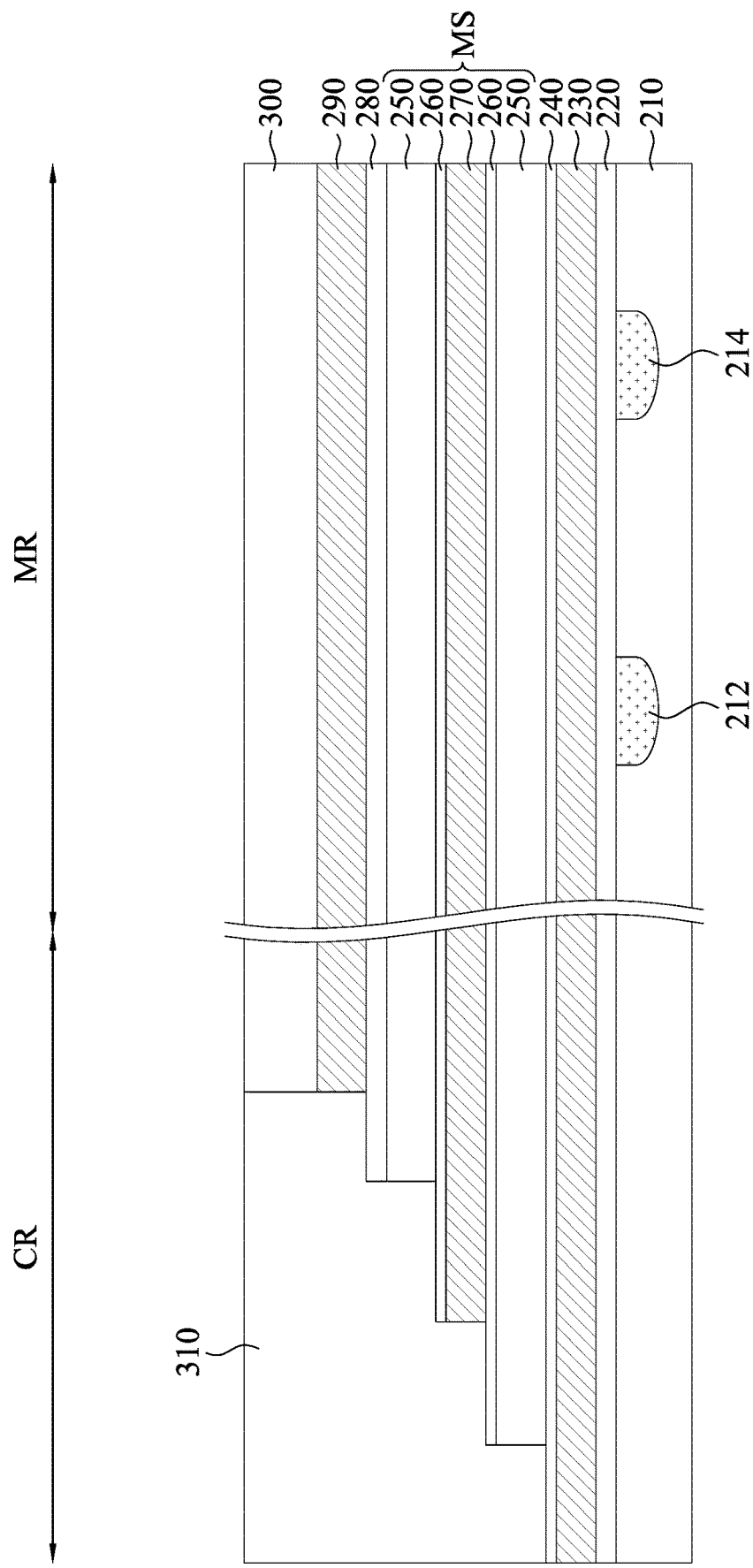

Referring to FIG. 4, the layers 220-300 in the contact region CR are patterned to form a stair structure. Within the contact region CR, each of the electrode layers 230 and 270 and the sacrificial layers 250 extends farther than any overlying electrode layers 230, 270, 290 or sacrificial layers 250.

For example, in some embodiments, the second select gate electrode layer 290 may have the least lateral length along a horizontal direction. The first-from-the-top sacrificial layer 250 may have a greater lateral length along the horizontal direction than that of the second select gate electrode layer 290. The erase electrode layer 270 may have a greater lateral length than that of the first-from-the-top sacrificial layer 250, and so on. For example, the second-from-the-top sacrificial layer 250 may have a greater lateral length than that of the erase electrode layer 270. The first select gate electrode layer 230 may have the greatest lateral length along the horizontal direction.

In some embodiments where the memory stacked layer MS may have three or more sacrificial layers 250 and plural erase electrode layers 270, each of the erase electrode layers 230 and the sacrificial layers 250 may extend farther than any overlying erase electrode layers 230 or the sacrificial layers 250, the first select gate electrode layer 230 may have the greatest lateral length along the horizontal direction, and the second select gate electrode layer 290 may have the least lateral length along the horizontal direction. In some embodiment, after the layers 220-300 in the contact region CR are patterned to form the stair structure, sidewalls of the layers 220-300 can be physically exposed.

Subsequently, a dielectric material 310 may be formed over the stair structure by deposition of a dielectric material therein. In some embodiments, the dielectric material 310 includes a dielectric fill material such as silicon oxide. The dielectric material 310 may have a material the same as that of the dielectric cap layer 300. Excess portions of the deposited dielectric material can be removed from above the top surface of the dielectric cap layer 300, for example, by chemical mechanical polish (CMP). If silicon oxide is employed for the dielectric material 310, the silicon oxide of the dielectric material 310 may, or may not, be doped with dopants such as B, P, and/or F.

Figure 5A:
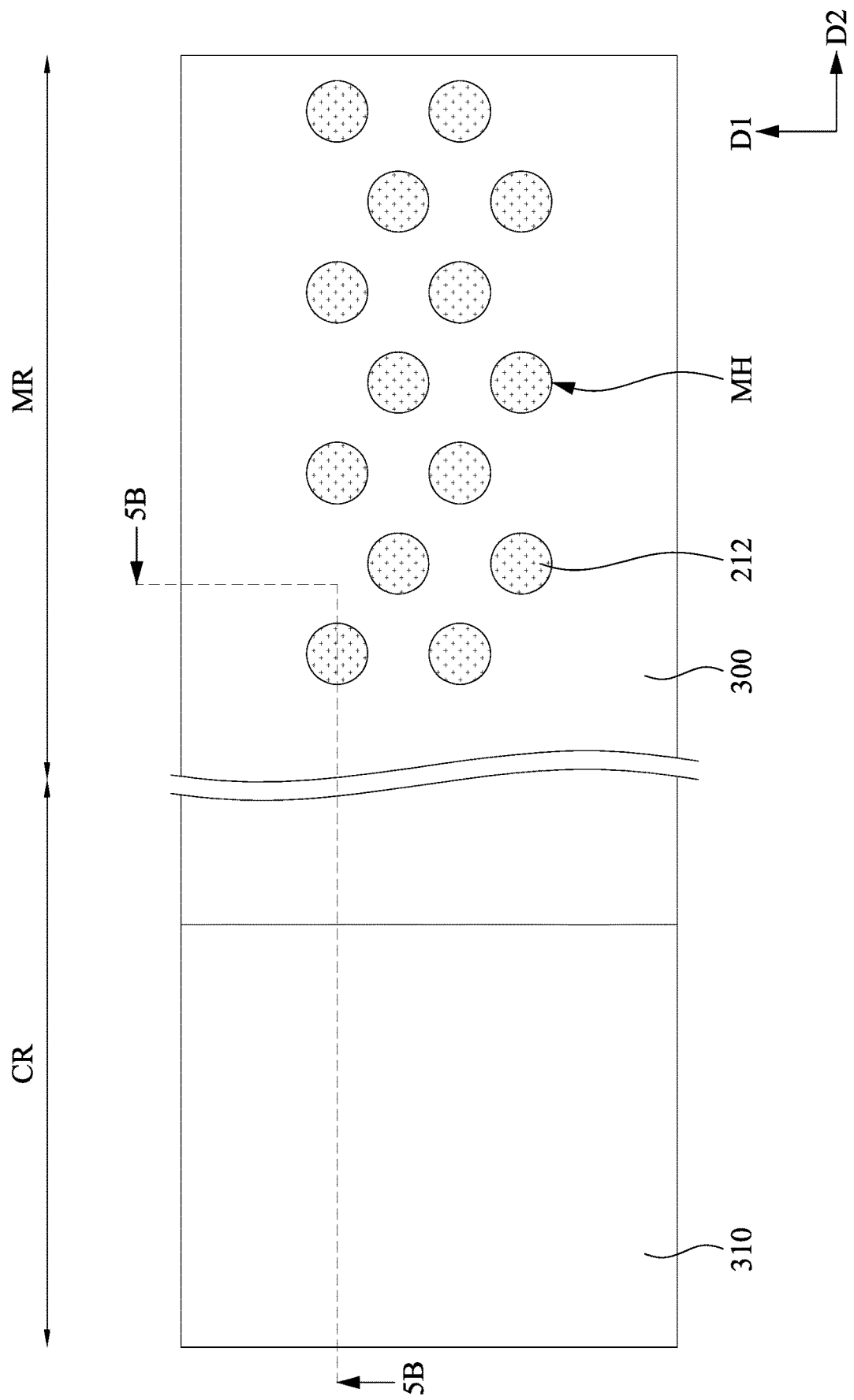
Figure 5B:
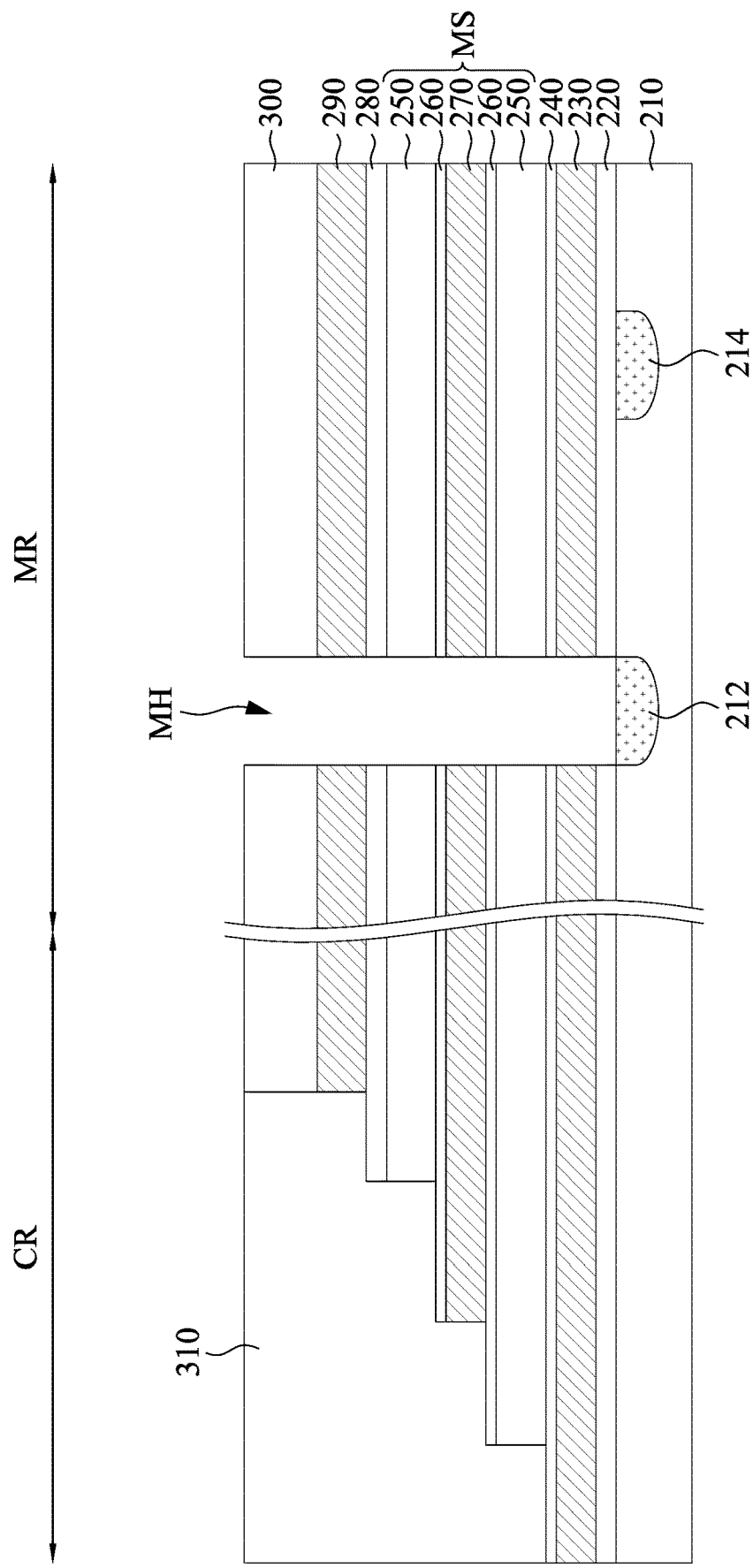

Referring to FIGS. 5A and 5B, FIG. 5B is a cross-sectional view taken along line 5B-5B of FIG. 5A. The layers 220-300 in the memory region MR are patterned to form plural holes MH exposing portions of the substrate 210. The patterning process may include suitable lithography process. For example, a lithographic material stack (not shown) including at least a photoresist layer can be formed over the dielectric cap layer 300 and the dielectric material 310, and may be lithographically patterned to form openings therein. The pattern in the lithographic material stack can be transferred through the layers 220-300 by at least one anisotropic etch that employs the patterned lithographic material stack as an etch mask. Portions of the layers 220-300 underlying the openings in the patterned lithographic material stack are etched to form memory holes MH. The chemistry of the anisotropic etch process employed to etch through the materials of the layers 220-300 can alternate to optimize etching the layers 220-300. The anisotropic etch can be, for example, a series of reactive ion etches. The sidewalls of the memory holes MH may be substantially vertical with respect to the topmost surface of the substrate 210. In some other embodiment, the sidewalls of the memory holes MH may be or can be tapered and slanted with respect to the topmost surface of the substrate 210. The patterned lithographic material stack can be subsequently removed, for example, by ashing.

In some embodiments of the present disclosure, each of the holes MH exposes a corresponding one of the source/drain regions 212. As the pattern of the source/drain regions 212, the holes MH may be formed in an array such that the holes MH may be alternatively aligned with each other in the first and second directions D1 and D2. In some embodiments, the memory holes MH may have bottom surfaces substantially coplanar with a top surface of the substrate 210. In some other embodiments, the etching process to the layers 220-300 may result in overetch to the semiconductor substrate 210 such that the surfaces of the semiconductor substrate 210 exposed by the memory holes MH may be further recessed.

Figure 6:
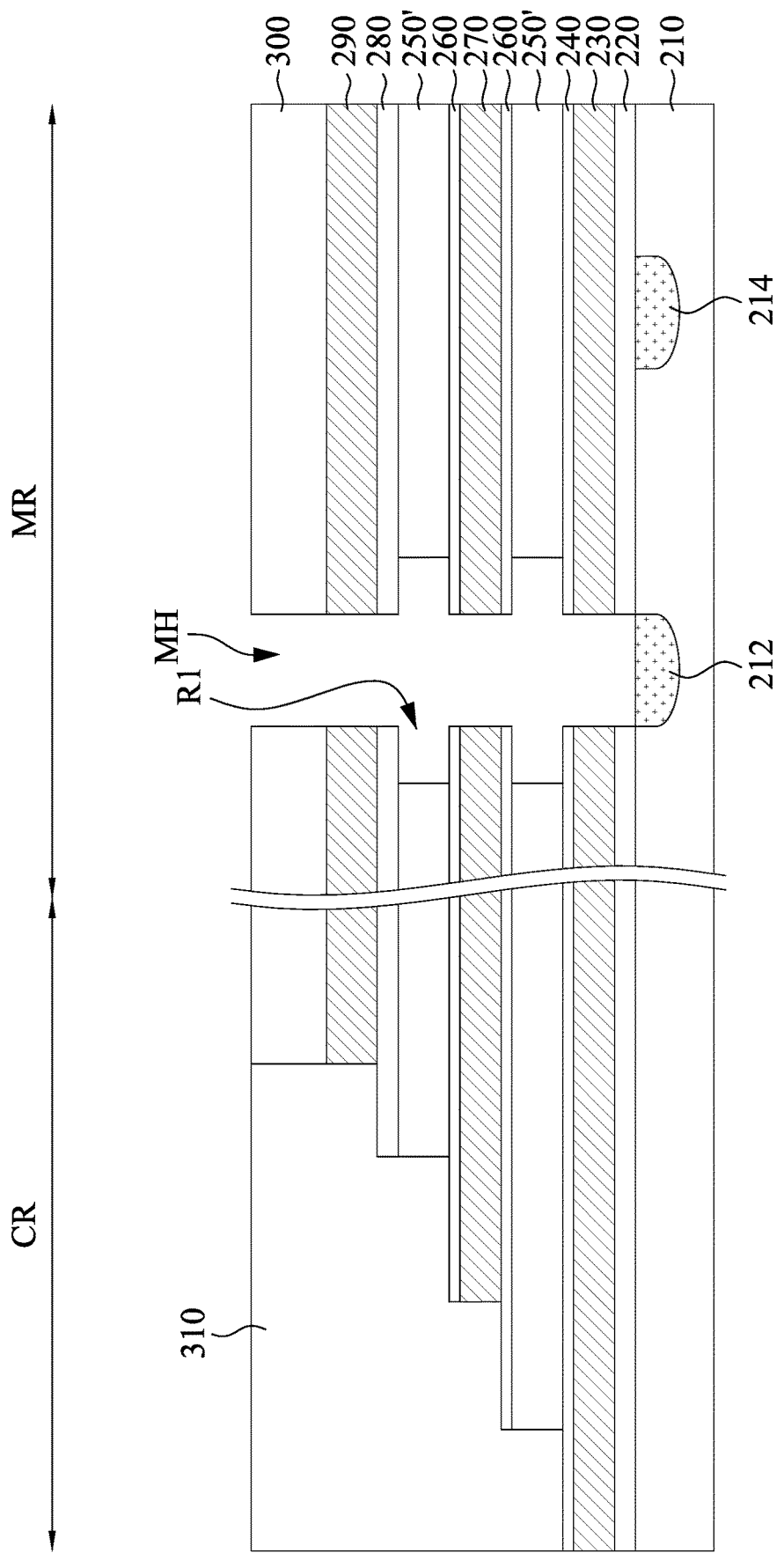

Reference is made to FIG. 6. One or more etching process are performed to the sacrificial layers 250 (referring to FIG. 5) through the memory holes MH, thereby forming recesses R1 on a sidewall of the memory holes MH. In the present embodiments, the etching process is controlled such that portions of the sacrificial layers 250 (referring to FIG. 5) adjacent to the memory holes MH are removed, and portions of the sacrificial layers 250 (referring to FIG. 5) away from the memory holes MH remain after the etching process. The remaining portions of the sacrificial layers 250 (referring to FIG. 5) away from the memory holes MH may be referred to as sacrificial layers 250' hereinafter. The etching process(es) may include suitable dry etch processes, which may use etchant gases, such as $H_3PO_4$ or the like. The dielectric layers 220, 240, 260, 280, 300, the dielectric material 310, and the electrode layers 230, 270, and 290 may have higher etch resistance to the etching process than that of the sacrificial layers 250 (referring to FIG. 5), and therefore the dielectric layers 220, 240, 260, 280, 300, the dielectric material 310, and the electrode layers 230, 270, and 290 may remain substantially intact after the etching process. In other word, etchant rates to the dielectric layers 220, 240, 260, 280, 300, the dielectric material 310, and to the electrode layers 230, 270, and 290 may be slower than an etchant rate to sacrificial layers 250 (referring to FIG. 5). In the present embodiments, the recesses R1 are formed between the dielectric layers 240, 260, and 280.

Figure 7:
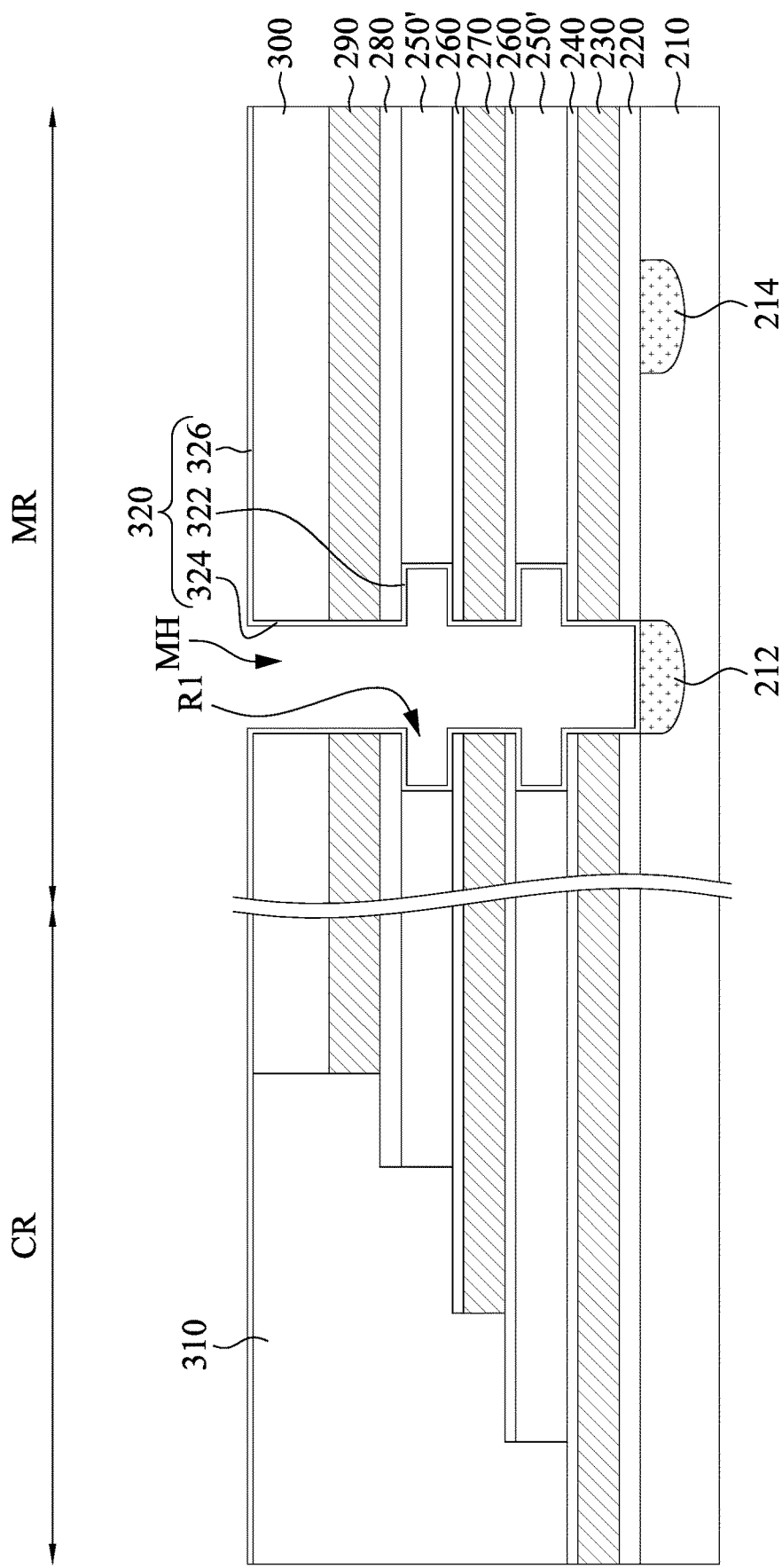

Reference is made to FIG. 7. A blocking layer 320 is conformably deposited over the structure of FIG. 6. The blocking layer 320 may have a portion 322 in the recess R1, a portion 324 on the sidewall of the memory hole MH, and a portion 326 outside the memory hole MH. In the present embodiments, the portions 322 of the blocking layer 320 may be in contact with the sacrificial layers 250'. The portions 324 of the blocking layer 320 may be in contact with the first select gate electrode layer 230, the erase gate electrode layer 270, and the second select gate electrode layer 290. The blocking layer 320 may have a thickness in a range from about 40 angstroms to about 40 angstroms. If the thickness of the blocking layer 320 is greater than about 60 angstroms, coupling ratio may be affected, which may lower device performance; if the thickness of the blocking layer 320 is less than about 40 angstroms, leakage current may be increased, which may lower device performance.

Figure 8:
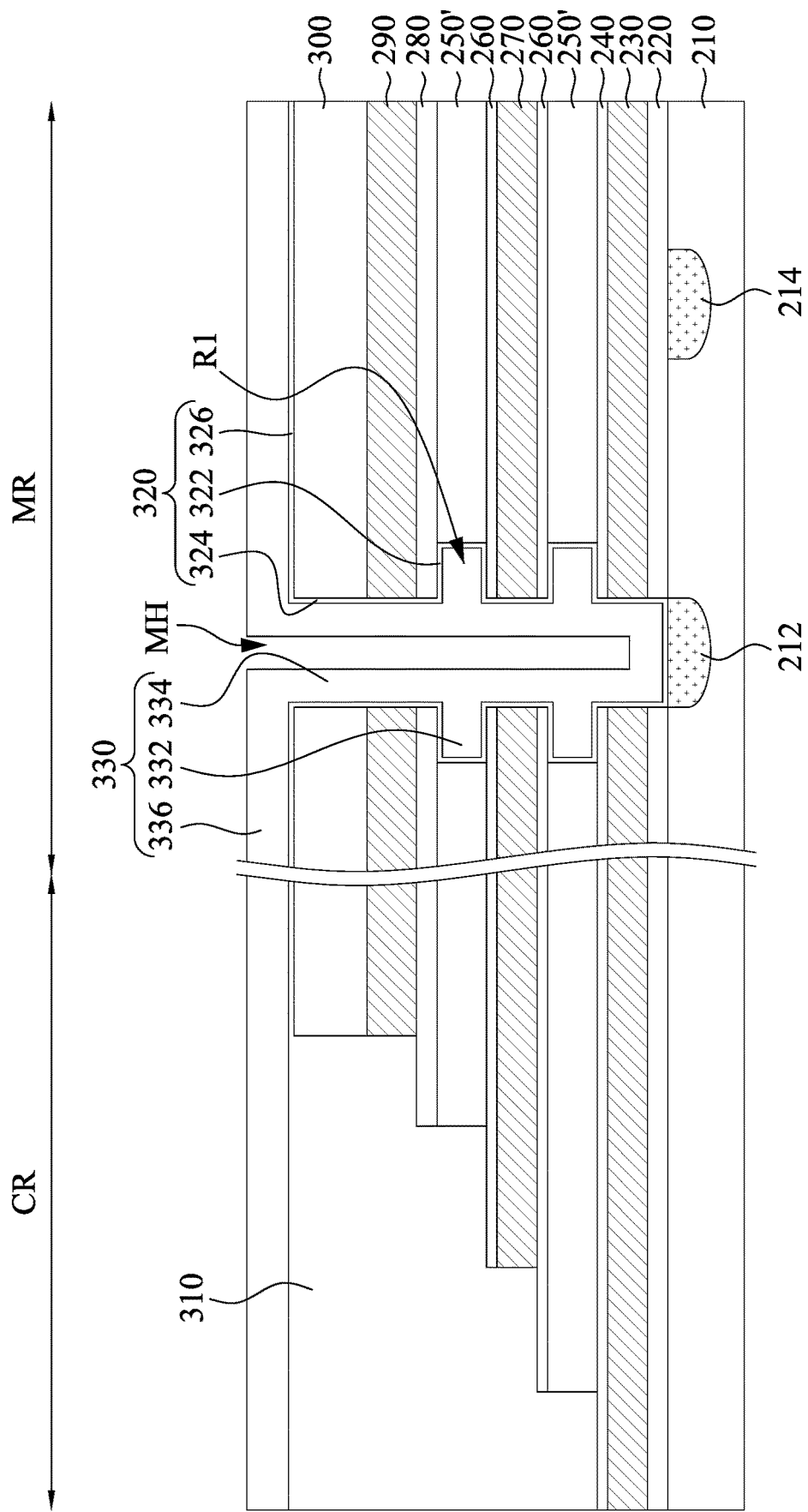

Reference is made to FIG. 8. A floating gate electrode layer 330 is conformably deposited over the structure of FIG. 7. The floating gate electrode layer 330 may include suitable material capable of storing charges, such as doped or undoped polysilicon or the like. In some embodiments the floating gate electrode layer 330 may include the same material as that of the gate electrode layers 230, 270, and/or 290. The material of the floating gate electrode layer 330 may be deposited, for example, by chemical vapor deposition (CVD) or the like.

In some embodiments, the floating gate electrode layer 330 may have a portion 332 in the recess R1, a portion 334 on the sidewall and bottom of the memory hole MH, and a portion 336 outside the memory hole MH. In the present embodiments, the floating gate electrode layer 330 may fill up the recesses R1 and not fill up the memory hole MH. For example, the floating gate electrode layer 330 has a recess surrounded by the portion 334.

Figure 9:
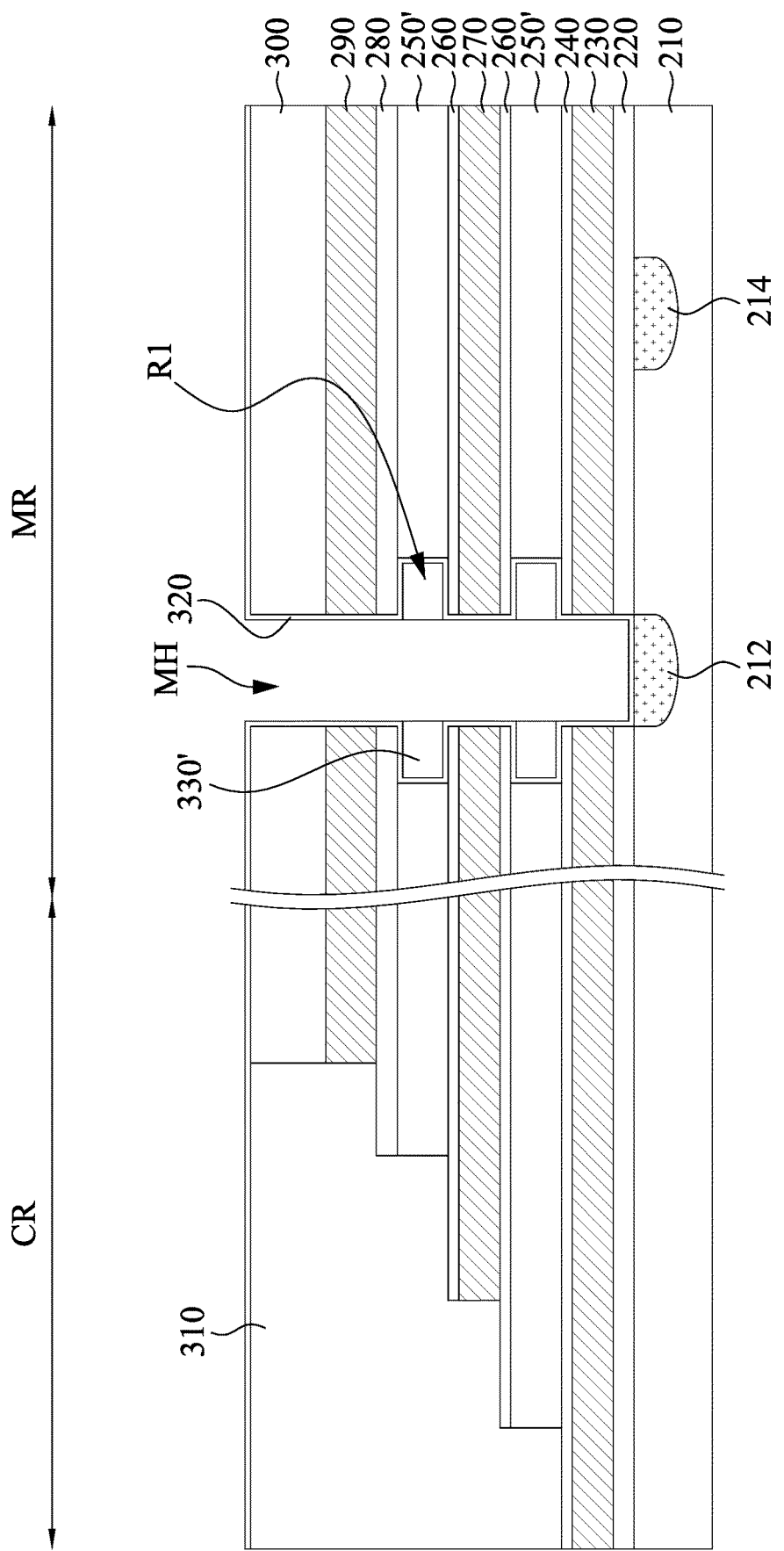

Reference is made to FIG. 9. One or more etching processes are performed to the floating gate electrode layer 330 (referring to FIG. 8), thereby removing the portions 334 and 336 of the floating gate electrode layer 330 (referring to FIG. 8). The portion 332 of the floating gate electrode layer 330 (referring to FIG. 8) in the recess R1 remains and may be referred to as floating gate electrodes 330' hereinafter. The etching process(es) may include suitable dry etch processes, which may use suitable etchant gases. In some embodiments, the blocking layer 320 may have a higher etch resistance to the etching process(es) than that of the electrode layers 230, 290, and 270 and the floating gate electrodes 330', thereby protecting the select gate electrode layers 230, 290, and the erase gate electrode layer 270 from being etched. In other word, an etchant rate to the blocking layer 320 may be slower than etchant rates the electrode layers 230, 290, and 270 and the floating gate electrodes 330'. Through the operation shown in FIG. 6-9, portions of the sacrificial layers 250 (referring to FIG. 5B) are respectively replaced with the floating gate electrodes 330'.

In some embodiments, the recess R1 may have a lateral depth in a range from about 100 angstroms to about 300 angstroms, and therefore the floating gate electrodes 330' may have a lateral length in a range from about 100 angstroms to about 300 angstroms. In some embodiments, the recess R1 may have a vertical length in a range from about 300 angstroms to about 400 angstroms, and therefore the floating gate electrodes 330' may have a vertical length in a range from about 300 angstroms to about 400 angstroms. If the lateral length of the floating gate electrodes 330' is greater than 300 angstroms, the programming operation may require a larger programming voltage; if the lateral length of the floating gate electrodes 330' is less than 100 angstroms, the floating gate may not store charges for long time. If the vertical length of the floating gate electrodes 330' is greater than 400 angstroms, coupling ratio may be affected, which may lower device performance; if the vertical length of the floating gate electrodes 330' is less than 300 angstroms, the programing operation becomes hard, and also it may induce short channel effect, which may lower device performance.

Figure 10:
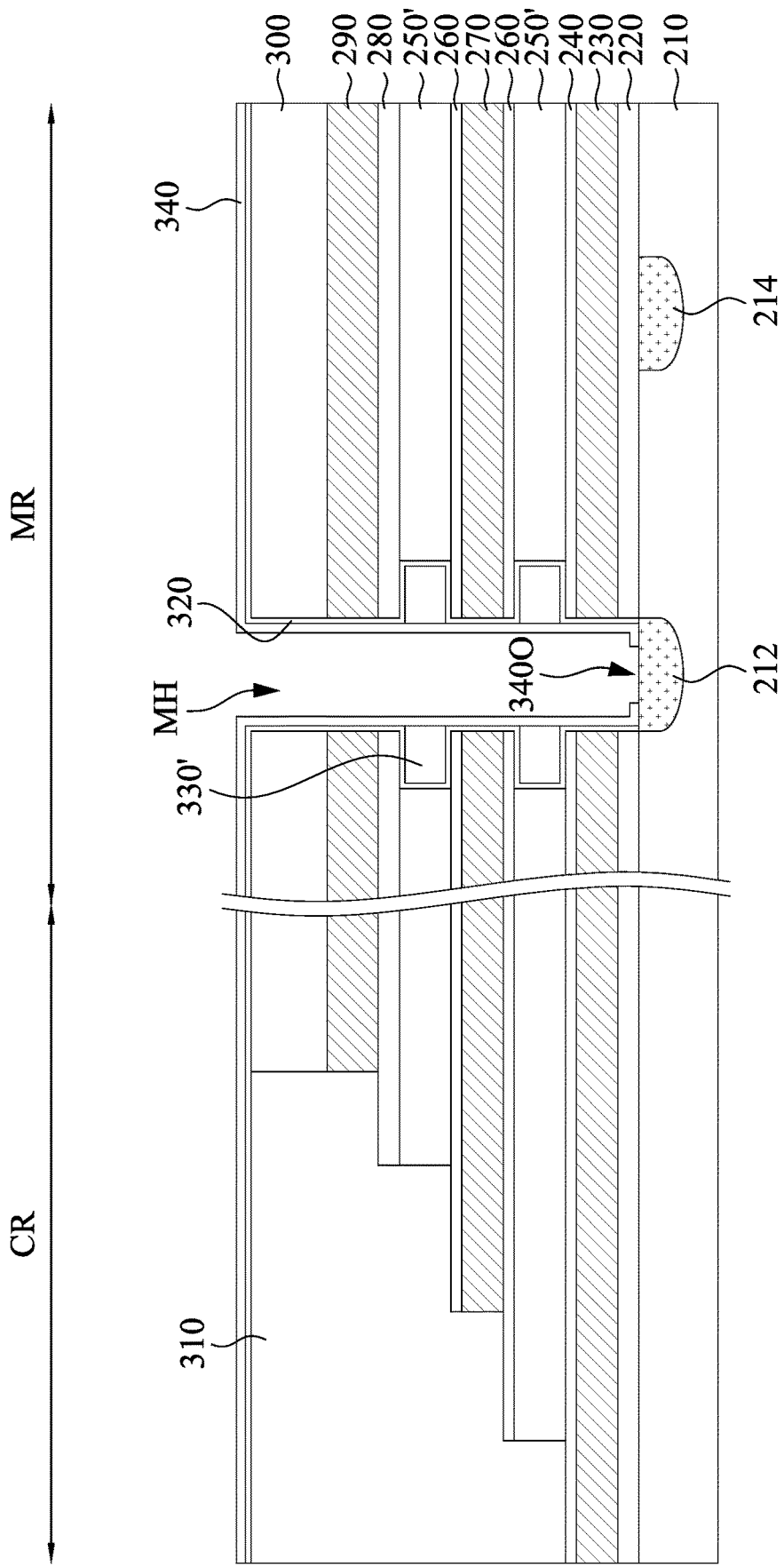

Reference is made to FIG. 10. A tunneling layer 340 is deposited over the structure of FIG. 9, and then patterned to have an opening 3400 exposing the source/drain region 212. In some embodiments, the tunneling layer 340 includes suitable dielectric material, such as silicon oxide. The tunneling layer 340 may include suitable a dielectric material, such as silicon oxide, or the like. In some embodiments, the material of the tunneling layer 340 may be similar to that of the dielectric layers 220, 240, 260, and/or 280. The material of the tunneling layer 340 may be different from that of the sacrificial layers 250'. Alternatively, in some other embodiments, the tunneling layer 340 may include a material the same as that of the sacrificial layers 250. The material of the tunneling layer 340 may be deposited, for example, by chemical vapor deposition (CVD). For example, if silicon oxide is employed for the tunneling layer 340, tetraethyl orthosilicate (TEOS) can be employed as the precursor material for the CVD process. Formation of the opening 3400 in the tunneling layer 340 may include suitable etching process, such as dry etching. The substrate 210 may have a higher etch resistance to the dry etching than that of the tunneling layer 340, and thereby not be further etched or recessed during the formation of the opening 3400.

The tunneling layer 340 may have a thickness in a range from about 60 angstroms to about 100 angstroms. If the thickness of the tunneling layer 340 is greater than about 100 angstroms, the programing and erasing speeds may be impacted and reduced; if the thickness of the tunneling layer 340 is less than about 60 angstroms, reliability concern may arise.

Figure 11:
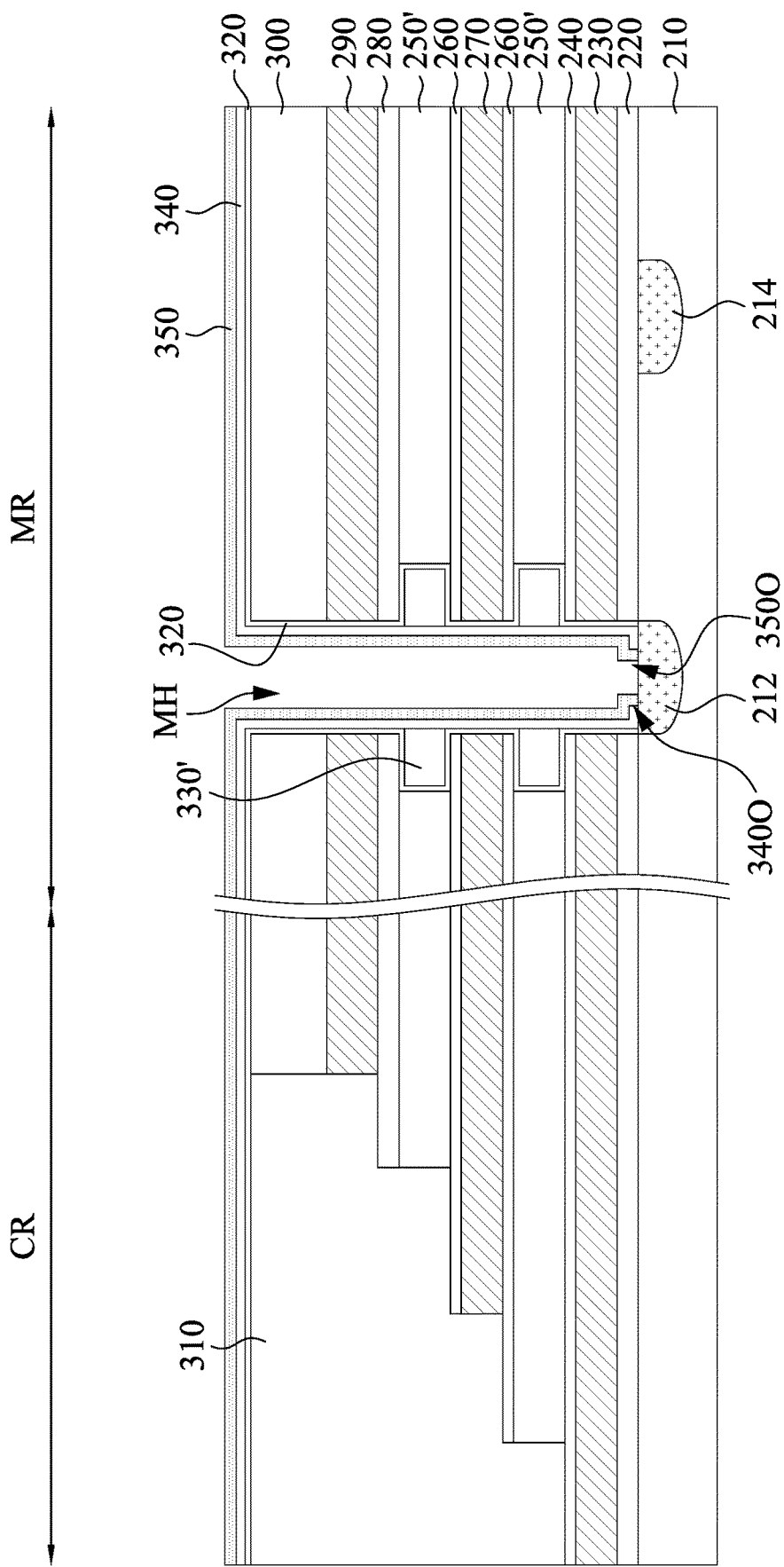

Reference is made to FIG. 11. A semiconductor layer 350 is deposited over the structure of FIG. 10, and then patterned to have an opening 3500 exposing the source/drain region 212. In some embodiments, the semiconductor layer 350 includes suitable intrinsic semiconductor material, such as intrinsic polysilicon or the like. In some embodiments, the intrinsic semiconductor layer 350 is not intentionally doped, for example, not having intentionally placed dopants, but rather having a doping resulting from process contaminants. For example, the intrinsic semiconductor layer 350 is an not intentional doped (NID) semiconductor layer and thus free from the dopants in the source/drain region 212. Alternatively, the semiconductor layer 350 may be doped with a p-type or an n-type, and with a doping concentration lower than that of the source/drain region 212. For example, the semiconductor layer 350 have dopant concentration lower than about $10^{13}/cm^3$. The semiconductor layer 350 may be deposited, for example, by atomic layer deposition (ALD), chemical vapor deposition (CVD). The semiconductor layer 350 may be deposited on the surface of the substrate 210, and thereby extending upward from a top surface of the substrate 210 through the layers 220-300. In some embodiments, the semiconductor layer 350 is deposited into the opening 3400 of the tunneling layer 340, and therefore in contact with the source/drain region 212. After the deposition, the opening 3500 is formed in the semiconductor layer 350 by suitable etching process. For example, the opening 3500 is etched in the deposited semiconductor layer, thereby exposing the region 212. Forming the opening 3500 in the semiconductor layer 350 results a limited contact area between the semiconductor layer 350 and the source/drain region 212.

In some embodiments, the semiconductor layer 350 may have a thickness in a range from about 50 angstroms to about 100 angstroms. If the thickness of the semiconductor layer 350 is greater than 100 angstroms, it may induce leakage issue, worse subthreshold swing (SS), and large distribution; if the thickness of the semiconductor layer 350 is less than 50 angstroms, the saturation current ($Id_{sat}$) may be too small to perform operations.

Figure 12A:
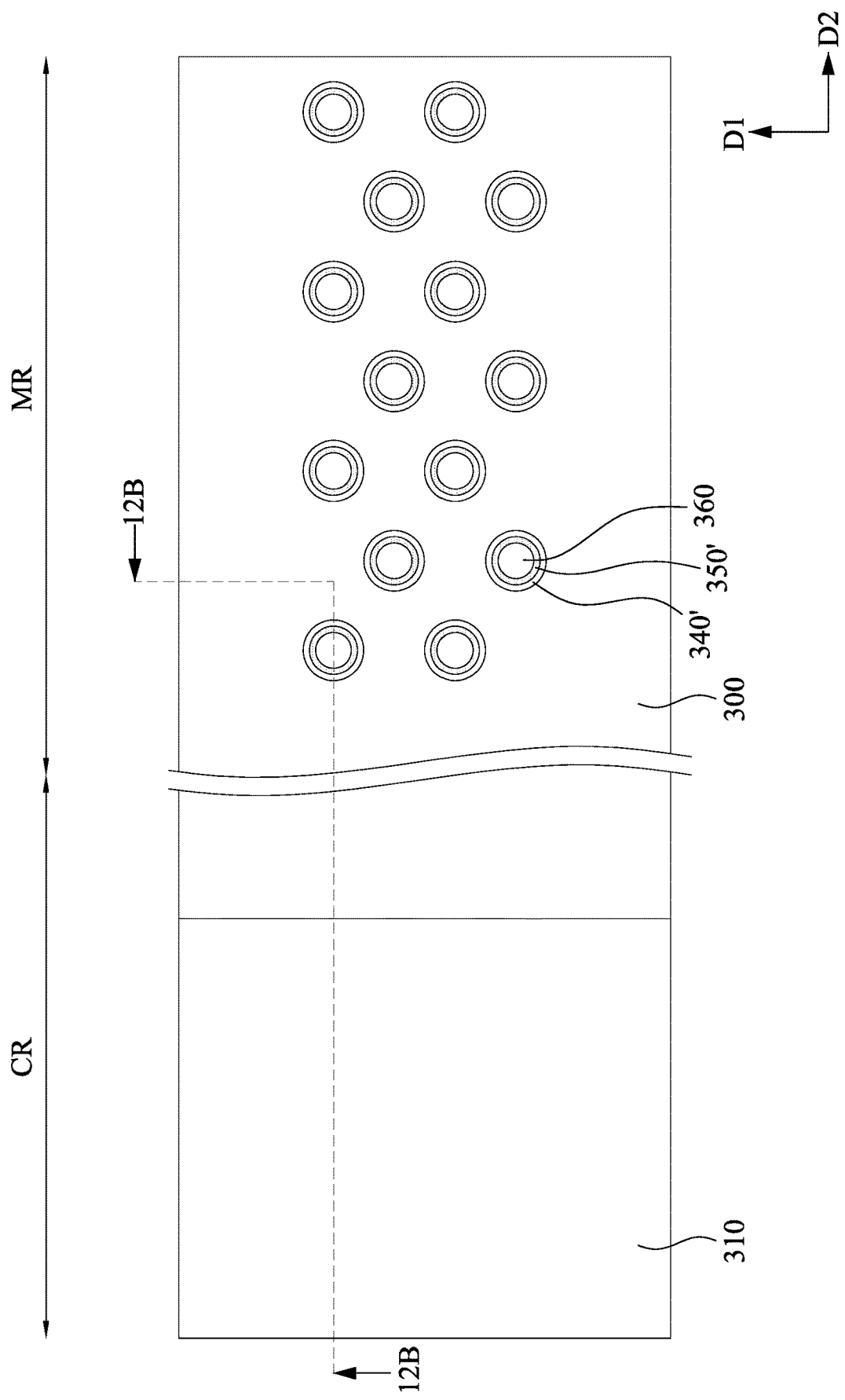
Figure 12B:
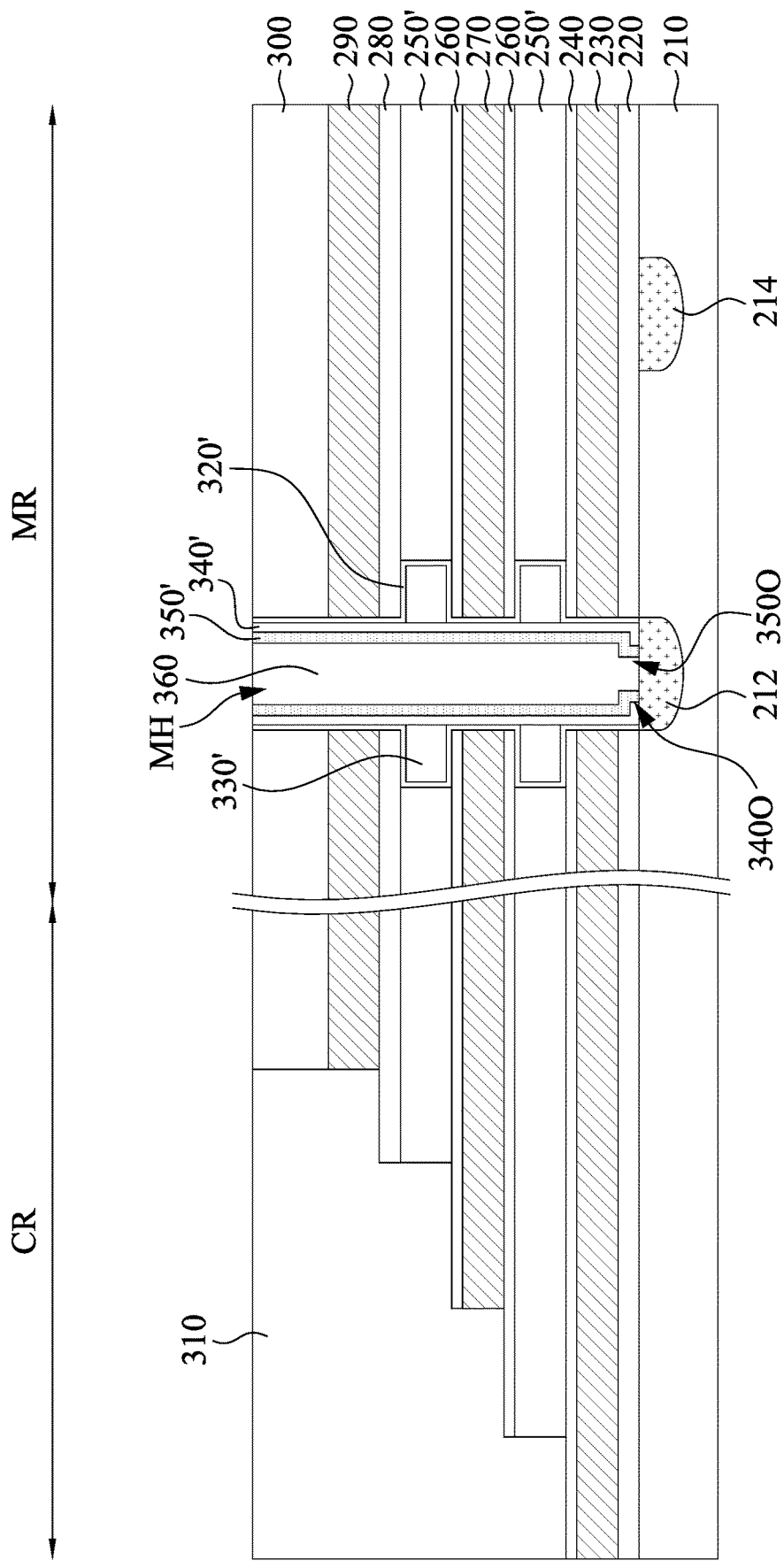

Reference is made to FIGS. 12A and 12B, FIG. 12B is a cross-sectional view taken along line 12B-12B of FIG. 12A. A dielectric filling material is deposited over the structure of FIG. 11 and fills up the memory hole MH and the opening 3500 in the semiconductor layer 350. Subsequently, a planarization process is performed to the dielectric filling material and the semiconductor layer 350 (referring to FIG. 11), thereby removing portions of the dielectric filling material and the semiconductor layer 350 (referring to FIG. 11)

outside the memory hole MH. The remaining dielectric filling material and the semiconductor layer 350 (referring to FIG. 11) may be respectively referred to a dielectric core 360 and a semiconductor layer 350'. The planarization process may include a chemical mechanical polish (CMP) process. In some embodiments, the CMP process may further remove portions of the tunneling layer 340 and the blocking layer 320 (referring to FIG. 11) over the top surface of the dielectric cap layer 300, and the remaining portions of the tunneling layer 340 and the blocking layer 320 (referring to FIG. 11) are referred to as a tunneling layer 340' and a blocking layer 320'. The CMP process may stop at the top surface of the dielectric cap layer 300. In some embodiments, the CMP process may further slightly consume top portions of the dielectric cap layer 300. In some other embodiments, the CMP process may stop at the top surface of the tunneling layer 340 (referring to FIG. 11), and therefore the tunneling layer 340 and the blocking layer 320 (referring to FIG. 11) may remain over the top surface of the dielectric cap layer 300. As aforementioned, between the dielectric core 360 and the tunneling layer 340', the semiconductor layer 350' has a limited contact area with the source/drain region 212.

Figure 12C:
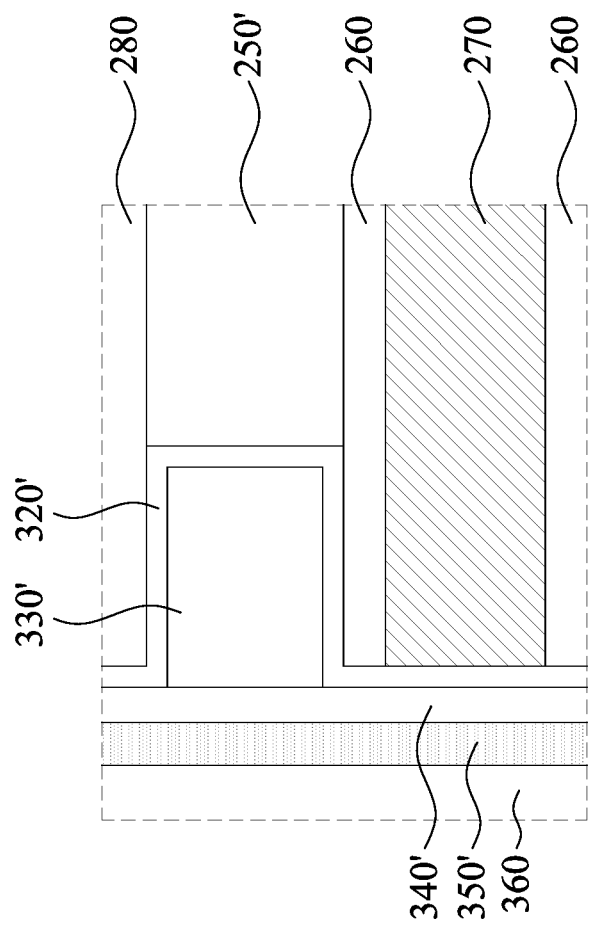

FIG. 12C is an enlarged view of a portion of FIG. 12B. In the present embodiments, the floating gate electrodes 330' are spaced apart from the semiconductor layer 350' by the tunneling layer 340', and the floating gate electrodes 330' are spaced apart from the sacrificial layers 250 by the blocking layer 320'. The erase gate electrode layer(s) 270' may be spaced apart from the semiconductor layer 350' by the tunneling layer 340' and the blocking layer 320'.

Figure 13A:
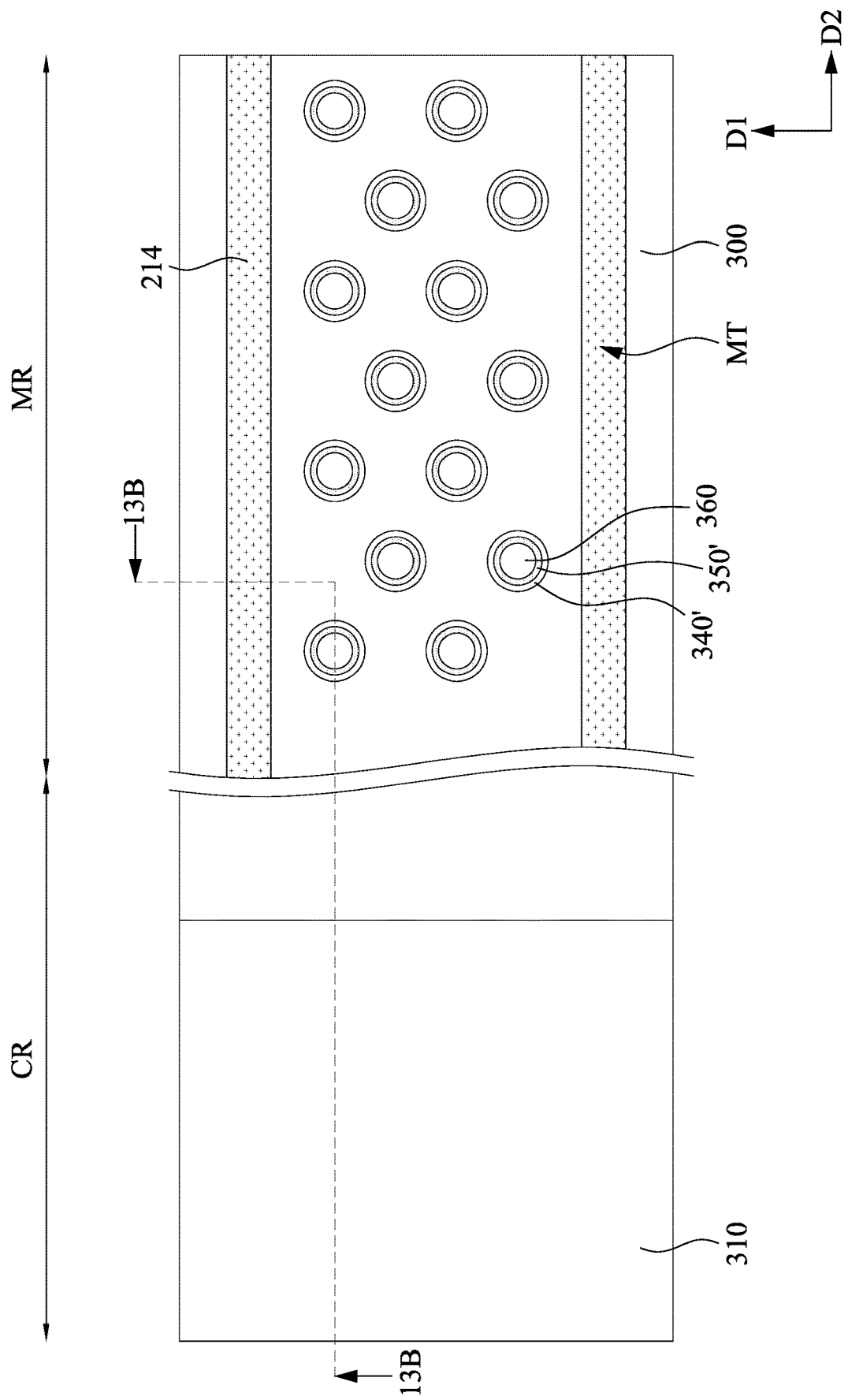
Figure 13B:
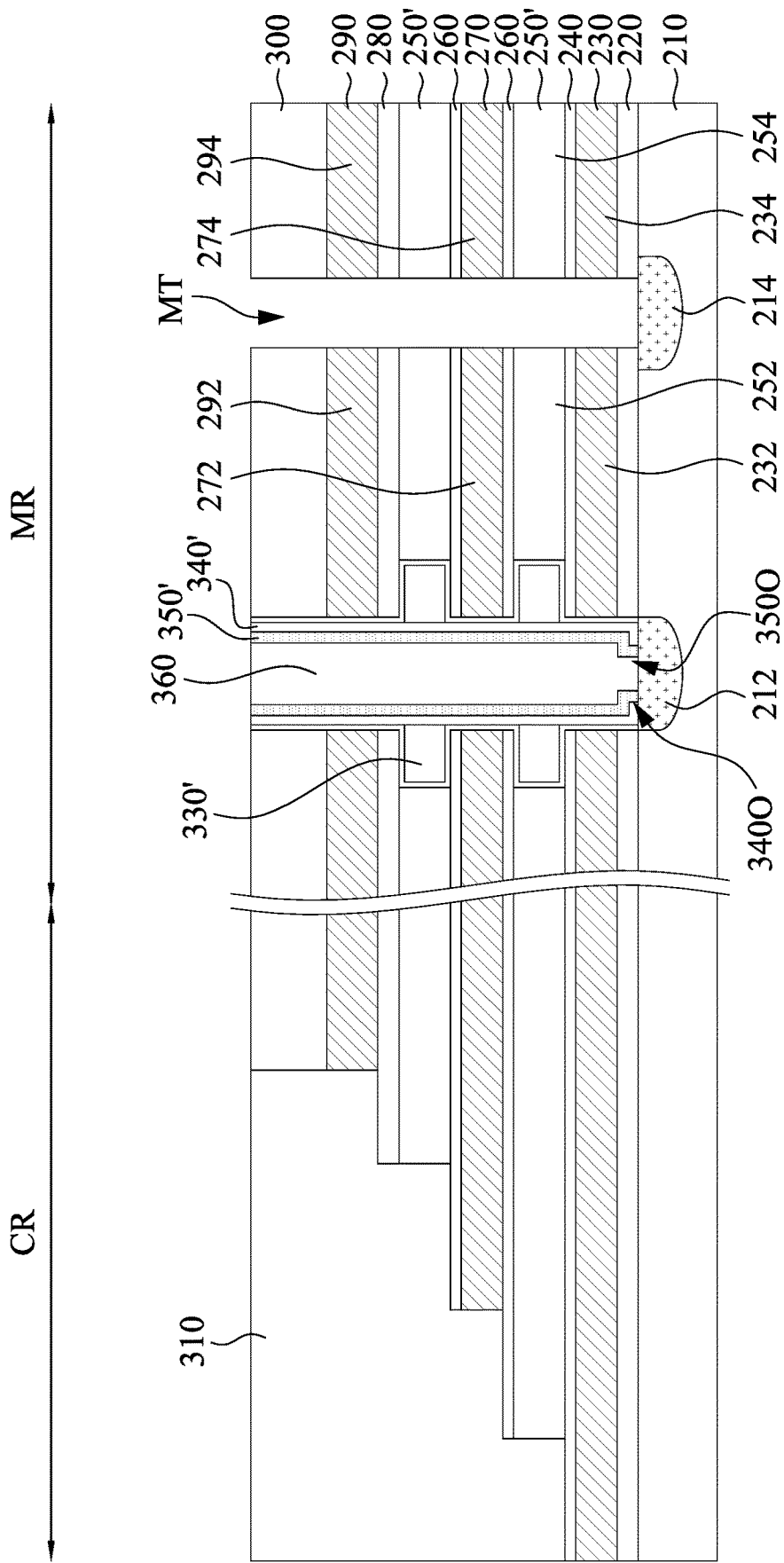

Referring to FIGS. 13A and 13B, FIG. 13B is a cross-sectional view taken along line 13B-13B of FIG. 13A. The layers 220-300 in the memory region MR are patterned to form plural trench openings MT exposing portions of the substrate 210. For example, the trench openings MT exposes the source/drain regions 214 in the substrate 210. The patterning process may include suitable lithography process. For example, a lithographic material stack (not shown) including at least a photoresist layer can be formed over the dielectric cap layer 300 and the dielectric material 310, and may be lithographically patterned to form openings therein. The pattern in the lithographic material stack can be transferred through the layers 220-300 by at least one anisotropic etch that employs the patterned lithographic material stack as an etch mask. Portions of the layers 220-300 underlying the openings in the patterned lithographic material stack are etched to form trench openings MT. The chemistry of the anisotropic etch process employed to etch through the materials of the layers 220-300 can alternate to optimize etching the layers 220-300. The anisotropic etch can be, for example, a series of reactive ion etches. The sidewalls of the trench openings MT may be substantially vertical with respect to the topmost surface of the substrate 210. In some other embodiment, the sidewalls of the trench openings MT may be or can be tapered and slanted with respect to the topmost surface of the substrate 210. The patterned lithographic material stack can be subsequently removed, for example, by ashing.

Through the formation of the trench openings MT, each of the layers 220-300 is patterned and cut into plural portions separated by the trench openings MT. For example, the first select gate electrode layer 230 is cut into separated select gate electrodes 232 and 234. For example, each of the sacrificial layers 250' is cut into plural separated portions 252 and 254. For example, the erase gate electrode layer 270 is cut into plural separated erase gate electrodes 272 and 274. For example, the second select gate electrode layer 290 is cut into separated select gate electrodes 292 and 294.

In some embodiments of the present disclosure, each of the trench openings MT exposes a corresponding one of the source/drain regions 214. As the pattern of the source/drain regions 214, the trench openings MT may be lines as viewed from top. In some embodiments, the trench openings MT may have bottom surfaces substantially coplanar with the top surface of the substrate 210. In some other embodiments, the etching process to the layers 220-300 may result in overetch to the semiconductor substrate 210 such that the surfaces of the semiconductor substrate 210 exposed by the trench openings MT may be further recessed.

Figure 14:
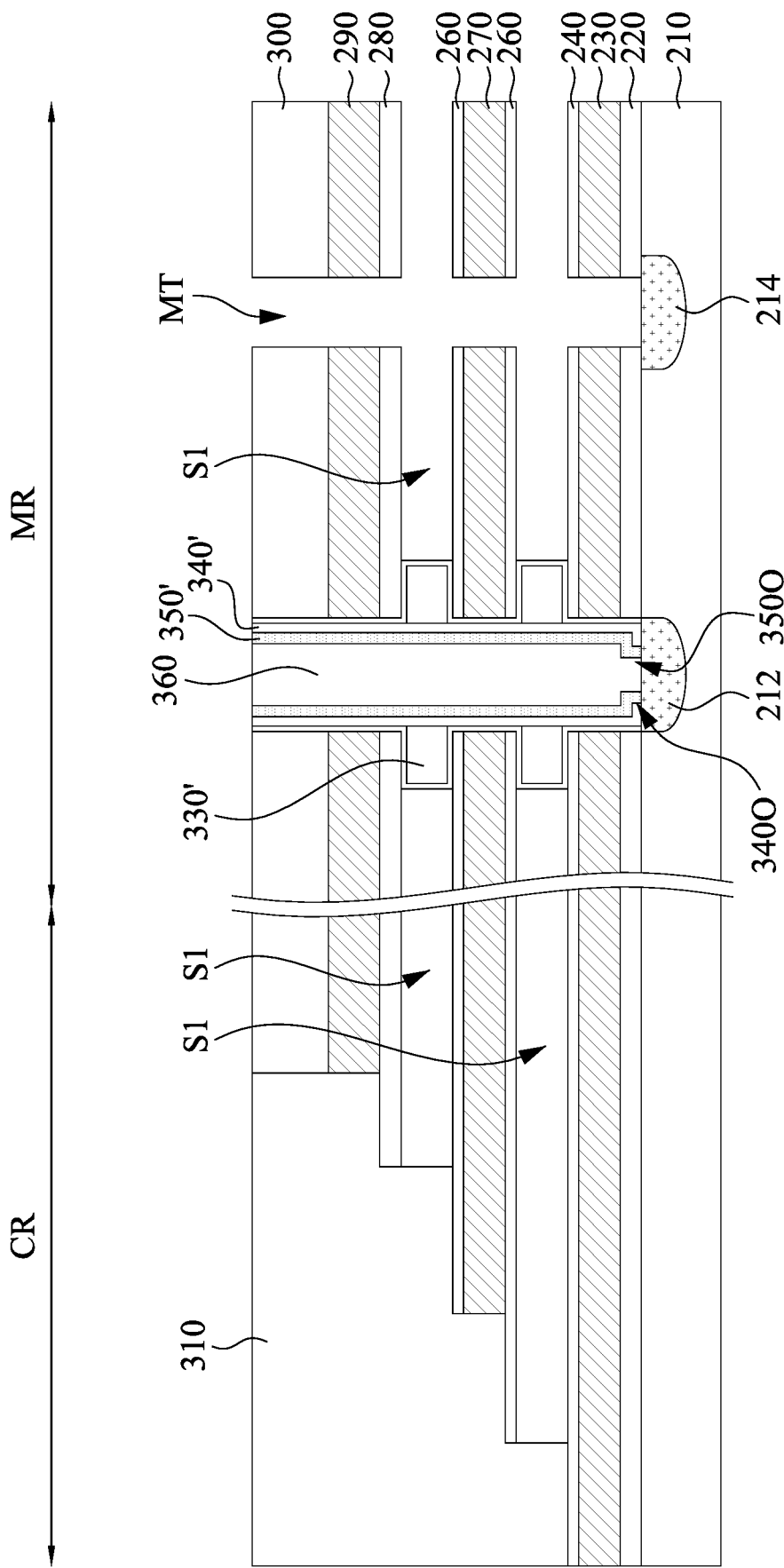

Reference is made to FIG. 14. One or more etching process are performed to the sacrificial layers 250' (referring to FIG. 13B) through the trench openings MT, thereby removing the sacrificial layers 250' (referring to FIG. 13B) and leaving recesses/spaces S1 between adjacent dielectric layers 240, 260, 280 and the dielectric material 310. In the present embodiments, the etching process is performed such that portions of the sacrificial layers 250' (referring to FIG. 13B) adjacent to the trench openings MT are removed. The etching process(es) may include suitable dry etch processes using suitable gases. In some embodiments, the dielectric layers 220, 240, 260, 280, 300, the dielectric material 310, and the electrode layers 230, 270, and 290 may have higher etch resistances to the etching process than that of the sacrificial layers 250' (referring to FIG. 13B), and therefore the dielectric layers 220, 240, 260, 280, 300, the dielectric material 310, and the electrode layers 230, 270, and 290 may remain substantially intact after the etching process. In other word, etchant rates to the dielectric layers 220, 240, 260, 280, 300, the dielectric material 310, and to the electrode layers 230, 270, and 290 are slower than an etchant rate to sacrificial layers 250' (referring to FIG. 13B).

Figure 15:
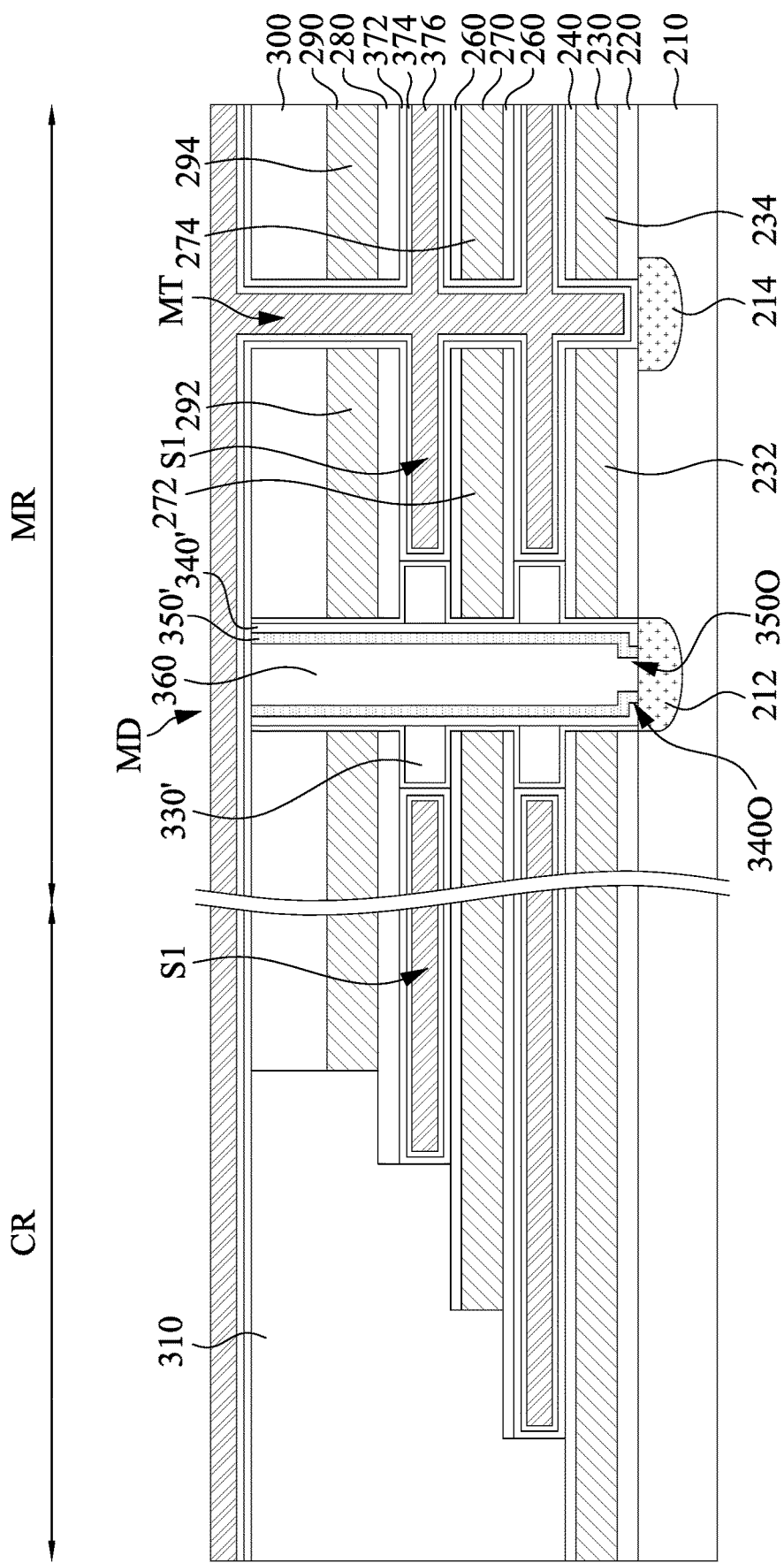

Reference is made to FIG. 15, where a first dielectric layer 372, a second dielectric layer 374, and a control gate electrode layer 376 are conformally deposited over the structure of FIG. 14. In the present embodiments, the first dielectric layer 372 is conformally deposited into the recesses/spaces S1, the second dielectric layer 374 is conformally deposited into the recesses/spaces S1 over the first dielectric layer 372, and then the control gate electrode layer 376 is deposited to fill up the trench opening MT and the recesses/spaces S1. The first dielectric layer 372 may include suitable dielectric materials, such as silicon nitride, or the like. The second dielectric layer 374 may include suitable dielectric materials, such as silicon oxide, or the like. The material of the first dielectric layer 372 may be different from that of the second dielectric layer 374. The dielectric layers 372 and 374 may have a thickness in a range from about 40 angstroms to about 60 angstroms. If the thickness of the dielectric layers 372 and 374 is greater than about 60 angstroms, it may affects coupling ratio, thereby lowering the performance during programing and erasing operations; if the thickness of the dielectric layers 372 and 374 is less than about 40 angstroms, reliability concern may arise. The control gate electrode layer 376 may include suitable conductive material, such as metal (e.g., tungsten, AlCu, or the like).

Figure 16A:
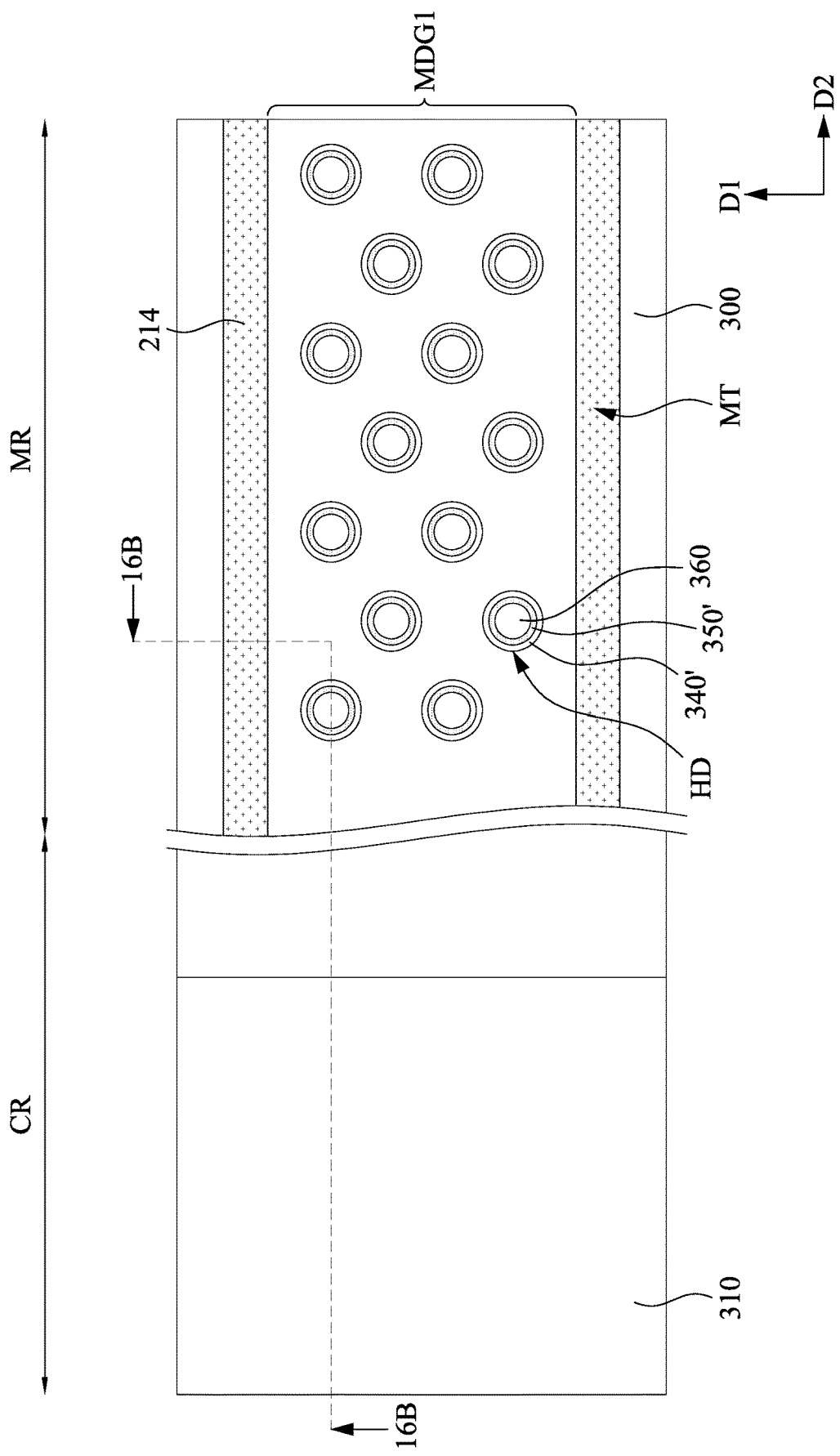
Figure 16B:
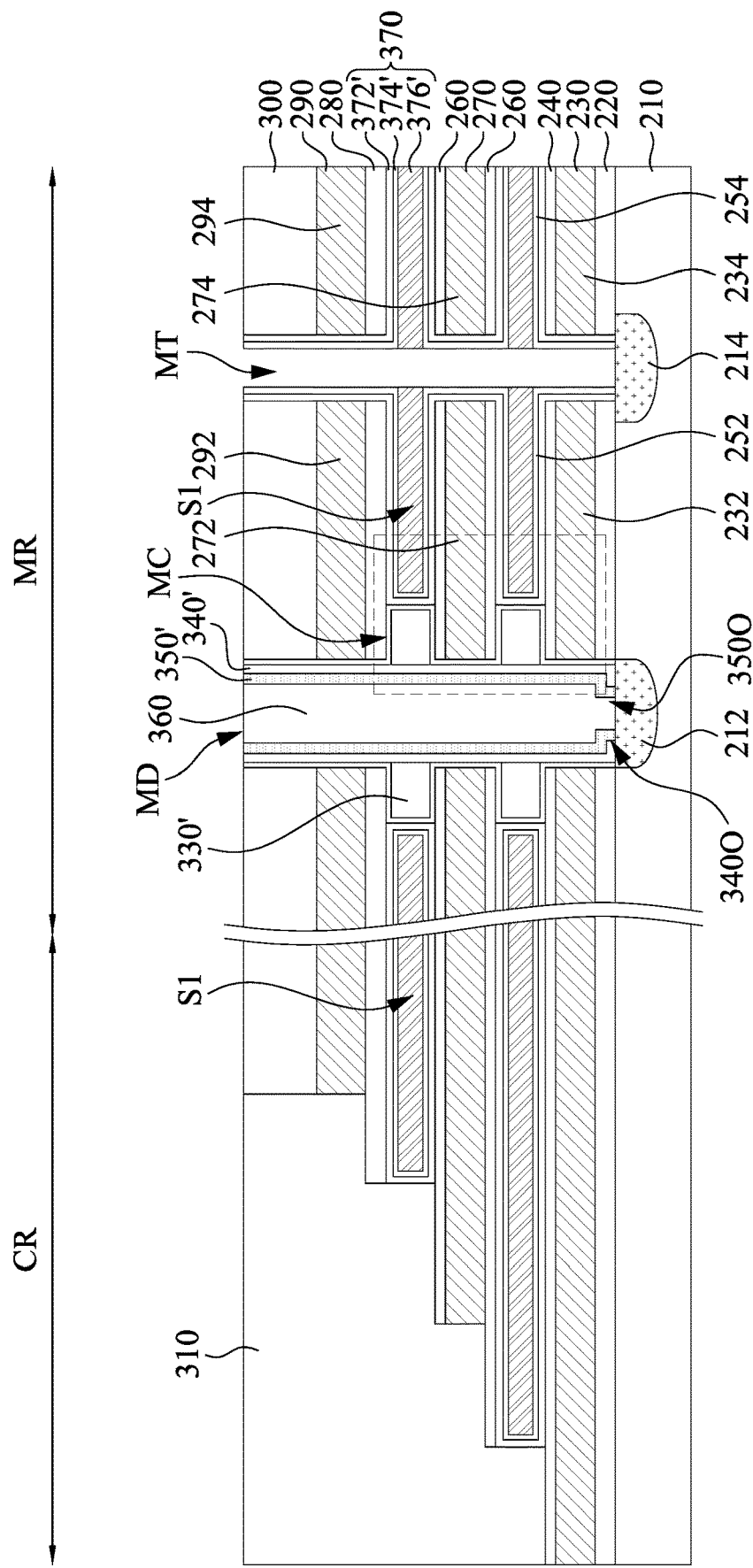

Reference is made to FIGS. 16A and 16B. FIG. 16B is a cross-sectional view taken along line 16B-16B of FIG. 16A. The layers 372-376 in FIG. 15 are patterned by suitable etching processes, thereby forming plural control gate stacks 370 respectively in the recesses/spaces S1. Each of the control gate stacks 370 includes a first dielectric layer 372', a second dielectric layer 374', and a control gate electrode 376', which are respectively patterned from the layers 372-376 in FIG. 15.

In some embodiments, the patterning includes a first etching process for etching the control gate electrode layer 376 in FIG. 15 and a second etching process for etching the layers 372 and 374 in FIG. 15. For example, the first etching process is performed to remove vertical portions of the control gate electrode layer 376 (referring to FIG. 15) in the trench opening MT, and remain horizontal portions of the control gate electrode layer 376 (referring to FIG. 15) in the recesses/spaces S1. The remaining horizontal portions of the control gate electrode layer 376 (referring to FIG. 15) may be referred to as the control gate electrode 376'. The first etching processes may include suitable dry etching. In some embodiments, the dielectric layers 374 may have a higher etch resistance to the first etching processes than that of the control gate electrode 376', thereby protecting the underlying dielectric layers and the electrode layers from being etched. In other word, an etchant rate to the dielectric layers 374 may be are slower than etchant rates to control gate electrode 376', other dielectric layers, and the electrode layers. In some embodiments, the first etching processes may also remove a portion of the control gate electrode layer 376 (referring to FIG. 15) above the dielectric cap layer 300 and the dielectric material 310. Through the etching processes, the control gate electrode layer 376 (referring to FIG. 15) is cut into plural separated control gate electrodes 376' in the recesses/spaces S1, respectively.

After the first etching process, a second etching process is performed to remove portions of the layers 372 and 374 (referring to FIG. 15) exposed by the trench opening MT, and remain other portions of the layers 372 and 374 (referring to FIG. 15) in the recesses/spaces S1. The remaining portions of the layers 372 and 374 may be referred to as the layers 372' and 374'. The second etching processes may include suitable anisotropic dry etching process. In some embodiments, the substrate 210 may have a higher etch resistance to the second etching process than that of the layers 372 and 374, thereby remain substantially intact after the second etching process. In some embodiments, the first etching process may also remove a portion of the layers 372 and 374 (referring to FIG. 15) above the dielectric cap layer 300 and the dielectric material 310. Through the second etching process, the source/drain regions 214 are exposed by the trench openings MT.

Through the operation shown in FIGS. 14-16B, the sacrificial layers 250' (referring to FIG. 13B) are respectively replaced with the control gate stacks 370, and therefore plural memory stack structures MD are formed. Each of the memory stack structures MD includes a first select gate electrode 232/234, a second select gate electrode 292/294, and plural memory cells MC between the select gate electrodes 232/234 and 292/294. FIG. 16C is an enlarged view of a portion of FIG. 16B. Each of the memory cells MC may include a portion of the semiconductor layer 350', a control gate stacks 370 and a floating gate electrode 330. For example, each of the semiconductor layers 350' may extend upward from a corresponding one of the source/drain regions 212 of the semiconductor substrate 210. The floating gate electrodes 330' surround the semiconductor layer 350', and the control gate stacks 370 (e.g., the control gate electrode 376') surround the floating gate electrode 330' and the semiconductor layer 350'. The erase gate electrode of the electrode gate electrode layer 270 (e.g., the erase gate electrode 272/274) may be over one of the floating gate electrodes 330' and one of the control gate stacks 370 and below another one of the floating gate electrodes 330' and another one of the control gate stacks 370. The erase gate electrode 272/274 may surround the semiconductor layer 350'. By providing suitable voltages to the control gate electrode 376' of the control gate stack 370 and the erase gate electrode, charges may be stored in or erased from the floating gate electrode 330', thereby realizing programming and erasing operations.

Figure 16C:
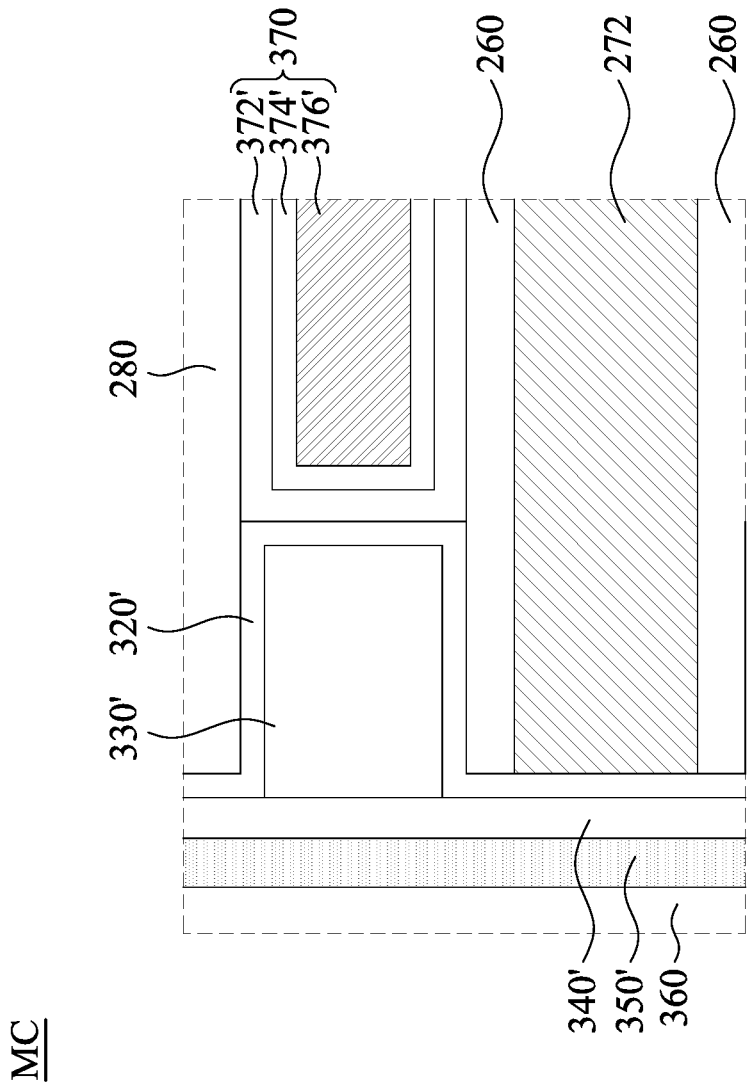

In the present embodiments, referring to FIGS. 16A-16C, the memory stack structures MD between adjacent trench openings MT are grouped (as the group MDG1-MDG2 in FIGS. 1B and 16A), and each group of the memory stack structures MD may share the same control gate stacks 370, the same erase gate electrode of the erase gate electrode layer 270 (e.g., the erase gate electrode 272 or 274), the same select gate electrode(s) of the first select gate electrode layer 230 (e.g., the select gate electrode 232 or 234), and the same select gate electrode of the second select gate electrode layer 290 (e.g., the select gate electrode 292 or 294). For example, the memory stack structures MD of the same group MDG1 shares the same control gate stack(s) 370, the erase gate electrode(s) 272, the select gate electrode 232, the select gate electrode 292, which are separated from another control gate stacks 370, the erase gate electrode 274, the select gate electrode 234, the select gate electrode 294 shared by another group of the memory stack structures MD. Furthermore, in the present embodiments, the memory stack structures MD of the same group MDG1 have the memory cells MC at the same level, and these memory cells MC at the same level may share the same control gate stack 370 and the same erase gate electrode 272, which are separated that of the memory stack structures MD of another group. For example, the control gate stack 370 may surround plural floating gate electrodes 330 at the same level and plural semiconductor layer 350' respectively surrounded by the floating gate electrodes 330, and the erase gate electrode may surround plural semiconductor layer 350'

Figure 17A:
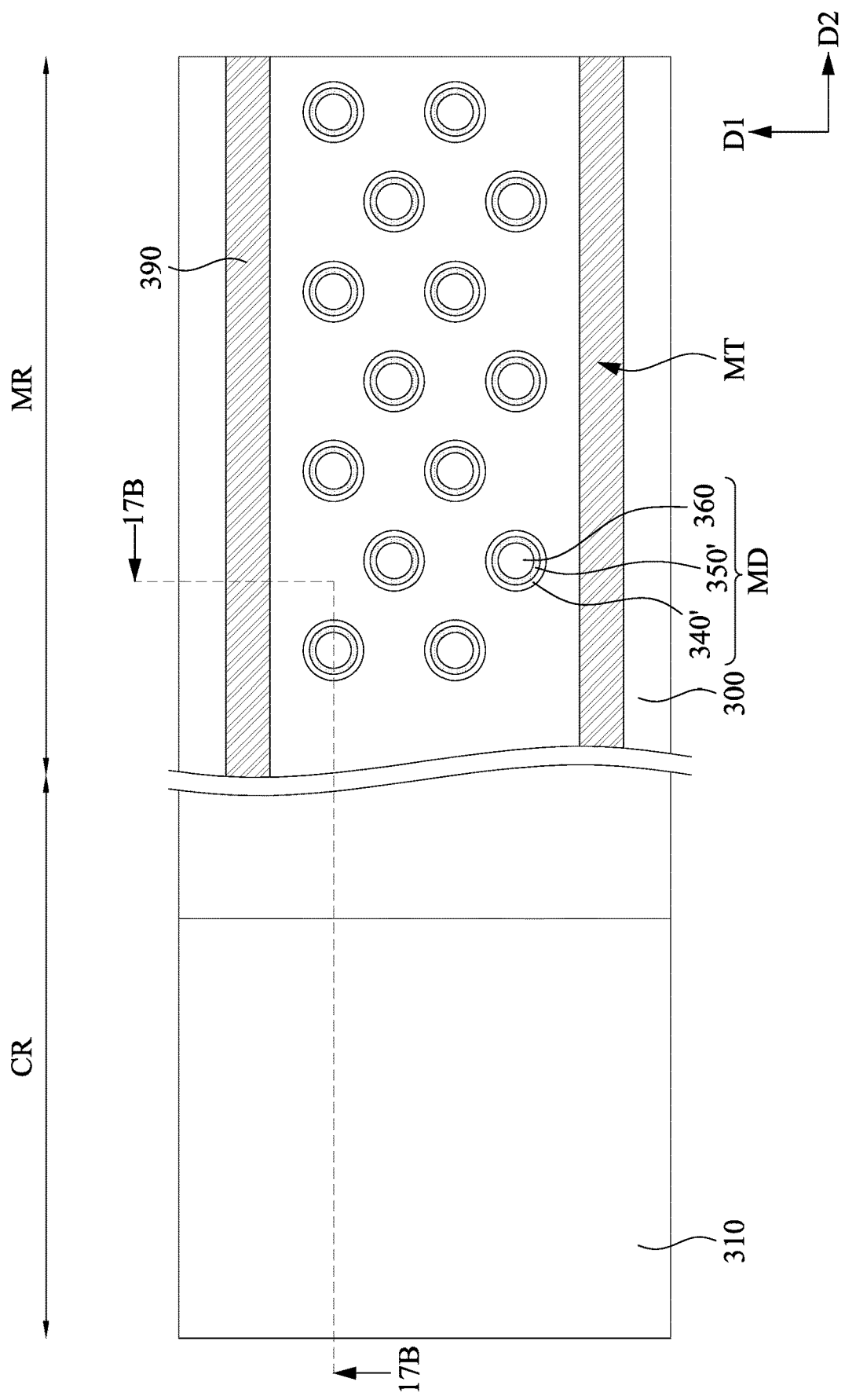
Figure 17B:
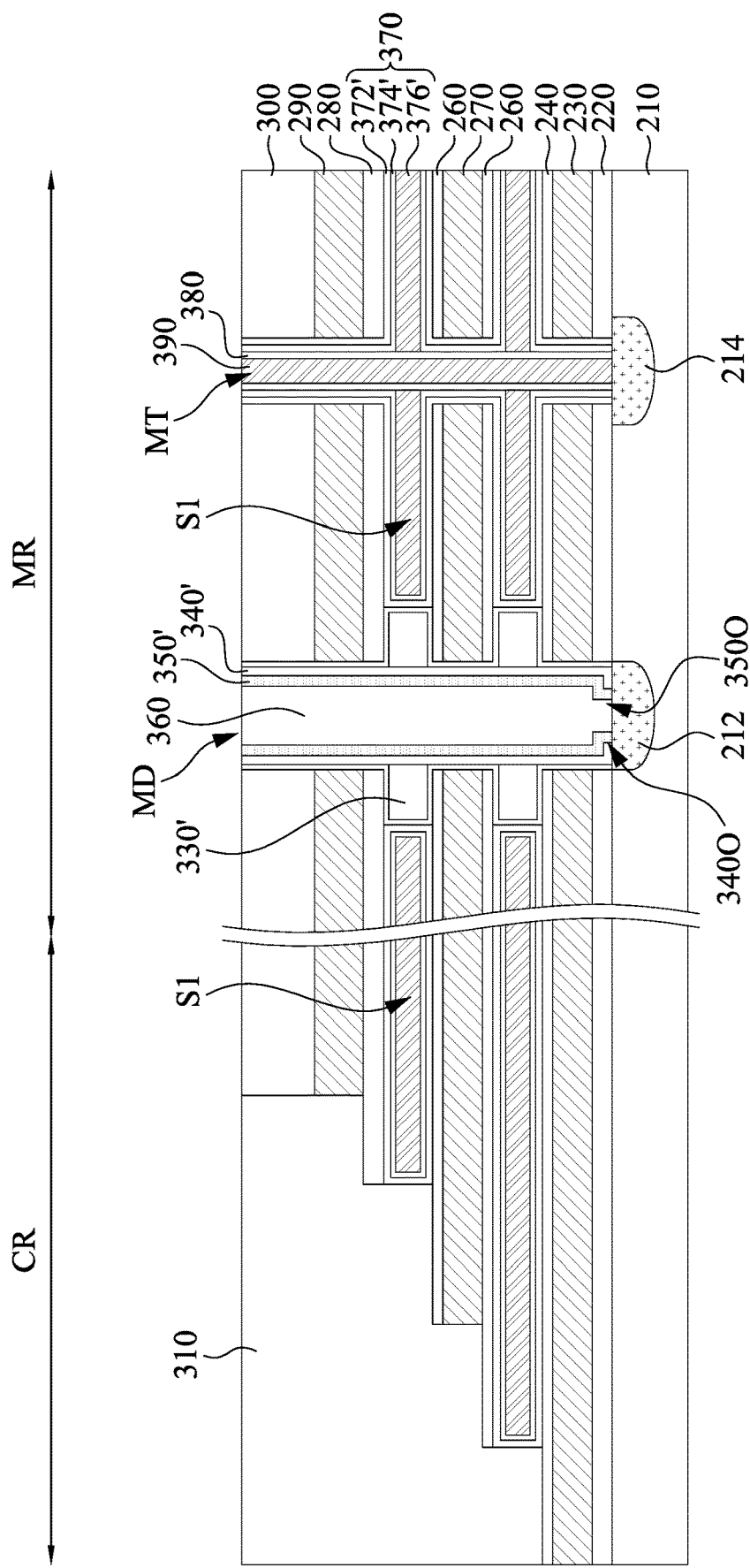

Referring to FIGS. 17A and 17B, FIG. 17B is a cross-sectional view taken along line 17B-17B of FIG. 17A. An isolation dielectric liner 380 and a conductive feature 390 are formed in the trench opening MT. The isolation dielectric liner 380 may include suitable dielectric materials, such as silicon oxide or the like. The conductive feature 390 may include suitable conductive materials, such as metal (e.g., tungsten, or the like).

In some embodiments, formation of the isolation dielectric liner 380 includes conformally depositing an isolation dielectric film over the structure of FIGS. 16A and 16B, and then removing horizontal portions of the isolation dielectric film by suitable anisotropic etching process, thereby forming the isolation dielectric liner 380. The isolation dielectric liner 380 may expose a top surface of the source/drain region 214. Subsequently, a conductive material is deposited over the isolation dielectric liner 380 to fill the trench opening MT. Subsequently, a CMP process may be performed to remove a portion of the conductive material out of the trench opening MT, thereby forming the conductive feature 390. The conductive feature 390 may be in contact with the top surface of the source/drain region 214. For brief illustration, the dielectric layers 372 and 374 and the isolation dielectric liner 380 are not shown in the top view.

Figure 18:
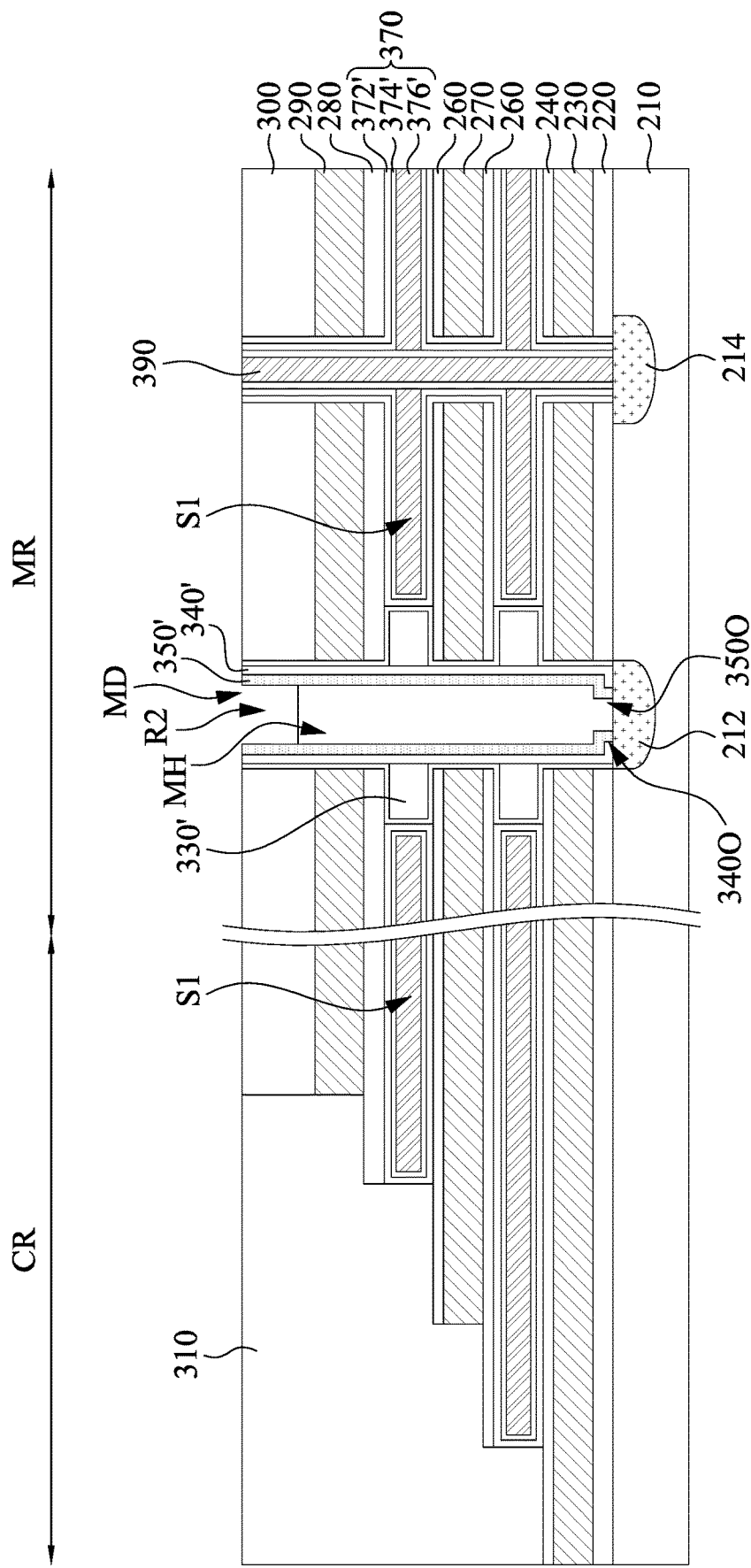

Referring to FIG. 18, a top surface of the dielectric core 360 can be further recessed within each memory hole MH, for example, by a recess etching process to a depth that is located between the top surface of the dielectric cap layer 300 and the bottom surface of the dielectric cap layer 300. For example, the recess etching process is performed to remove a portion of the dielectric core 360, thereby forming a recess R2 over the top surface of the remaining dielectric core 360. The recess etching processes may include suitable dry etching. In some embodiments, the semiconductor layer 350' may have a higher etch resistance to the recess etching process than that of the dielectric core 360, such that the semiconductor layer 350' may remain substantially intact after the recess etching process. In other word, an etchant rate to the semiconductor layer 350' may be are slower than an etchant rate to dielectric core 360.

Figure 19:
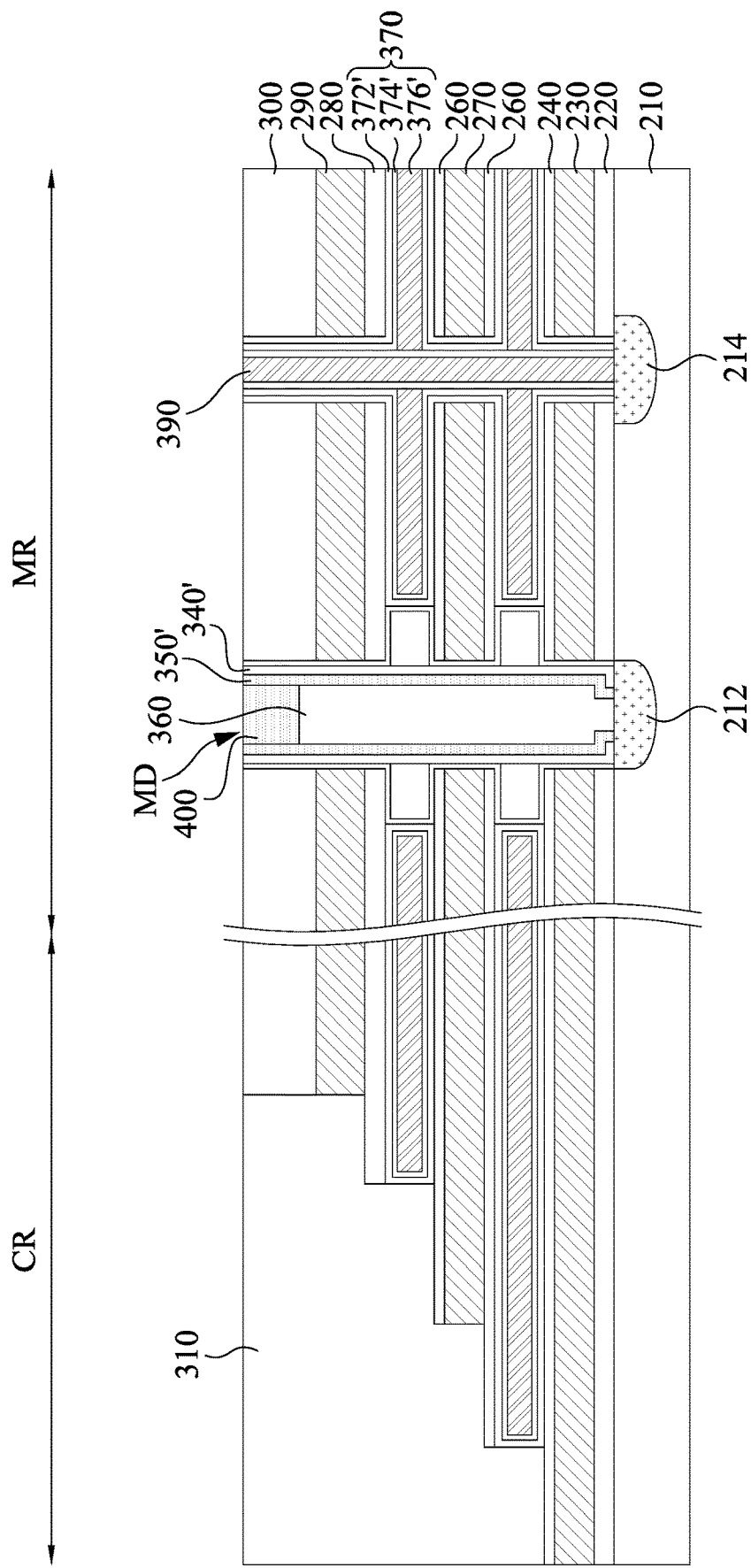

Referring to FIG. 19, a conductive feature 400 is deposited over the top surface of the dielectric core 360, thereby being surrounded by a top portion of the semiconductor layer 350'. The conductive feature 400 may include suitable semiconductor materials, such as doped polysilicon, or the like. The semiconductor material may be p-type doped regions and/or n-type doped regions. The semiconductor material may have a dopant concentration higher than about $10^{18}/cm^3$. The semiconductor material may be formed using one or more epitaxy or epitaxial (epi) processes. The epitaxy processes include CVD deposition techniques (e.g., vapor-phase epitaxy (VPE) and/or ultra-high vacuum CVD (UHV-CVD)), molecular beam epitaxy, and/or other suitable processes. The semiconductor material may be in-situ doped. The doping species include p-type dopants, such as boron or $BF_2$; n-type dopants, such as phosphorus or arsenic; and/or other suitable dopants including combinations thereof. If the semiconductor material is not in-situ doped, a second implantation process (i.e., a junction implant process) is performed to dope the semiconductor material. One or more annealing processes may be performed to activate the semiconductor material. The annealing processes include rapid thermal annealing (RTA) and/or laser annealing processes. Excess portions of the semiconductor material can be removed from above the top surface of the dielectric cap layer 300, for example, by chemical mechanical planarization (CMP).

In some other embodiments, the conductive feature 400 may be made of suitable metal material, such as tungsten. The metal material may be deposited by suitable deposition techniques. Excess portions of the metal material can be removed from above the top surface of the dielectric cap layer 300, for example, by chemical mechanical planarization (CMP).

Figure 20:
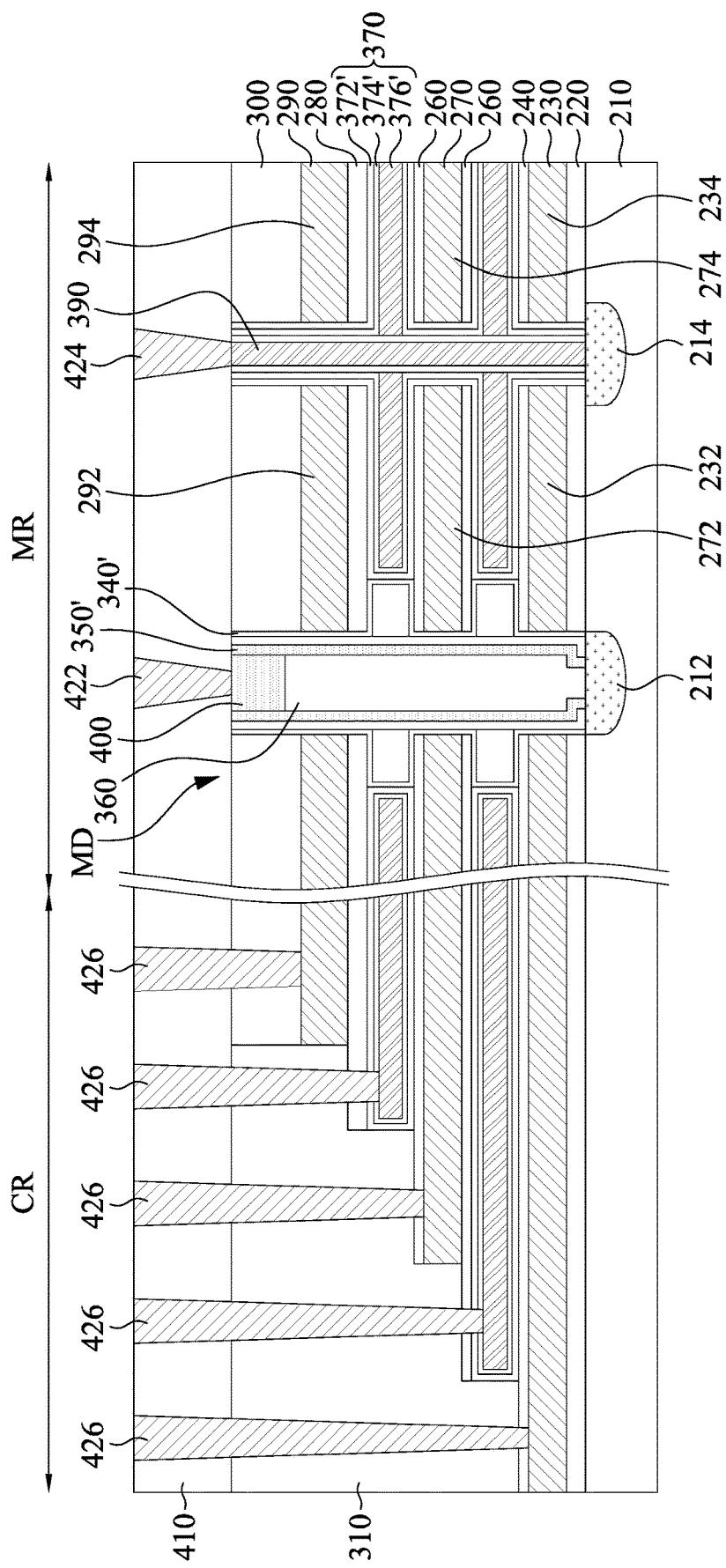

Referring to FIG. 20, a dielectric layer 410 is deposited over the structure of FIG. 19, and then contacts 422 and 424 are formed in the dielectric layer 410 to respectively connect the conductive feature 400 and the conductive feature 390. In some embodiments, the contacts 426 may be formed in the dielectric layer 410 and the dielectric material 310 to respectively connect the first select gate electrode layer 230 (e.g., the select gate electrodes 232 and 234), the control gate electrode 376', the erase gate electrode layer 270 (e.g., the select gate electrodes 272 and 274), the control gate electrode 376', and the second select gate electrode layer 290 (e.g., the select gate electrodes 292 and 294).

The dielectric layer 410 may be an extra low-k dielectric (ELK) layer, such as carbon doped silicon dioxide, may be an oxide, such as silicon oxide, and/or may be the like or a combination thereof. In some embodiments, the dielectric layer 410 may be formed of a low-k dielectric material having a k value less than about 3.9. The k value of the dielectric layer 410 may even be lower than about 2.8. In some embodiments, the dielectric layer 410 may have the same material as the underlying dielectric material 310. In some embodiments, the contacts 422-426 may be copper, aluminum, tungsten, the like, and/or a combination thereof.

Formation of the dielectric layer 410 and the contacts 422-426 includes, for example, depositing the dielectric layer 410 using a spin-on process, etching contact holes in the dielectric layer 410 to expose the respective conductive feature 400, the respective conductive feature 390, and the respective electrodes 232, 234, 272, 274, 292, 294, and 376', filling the contact holes with metals using a suitable deposition technique, and performing a planarization process (e.g. CMP) to remove excess metals outside the via holes while leaving metals in the contact holes to serve as the contacts 422-426.

Figure 21A:
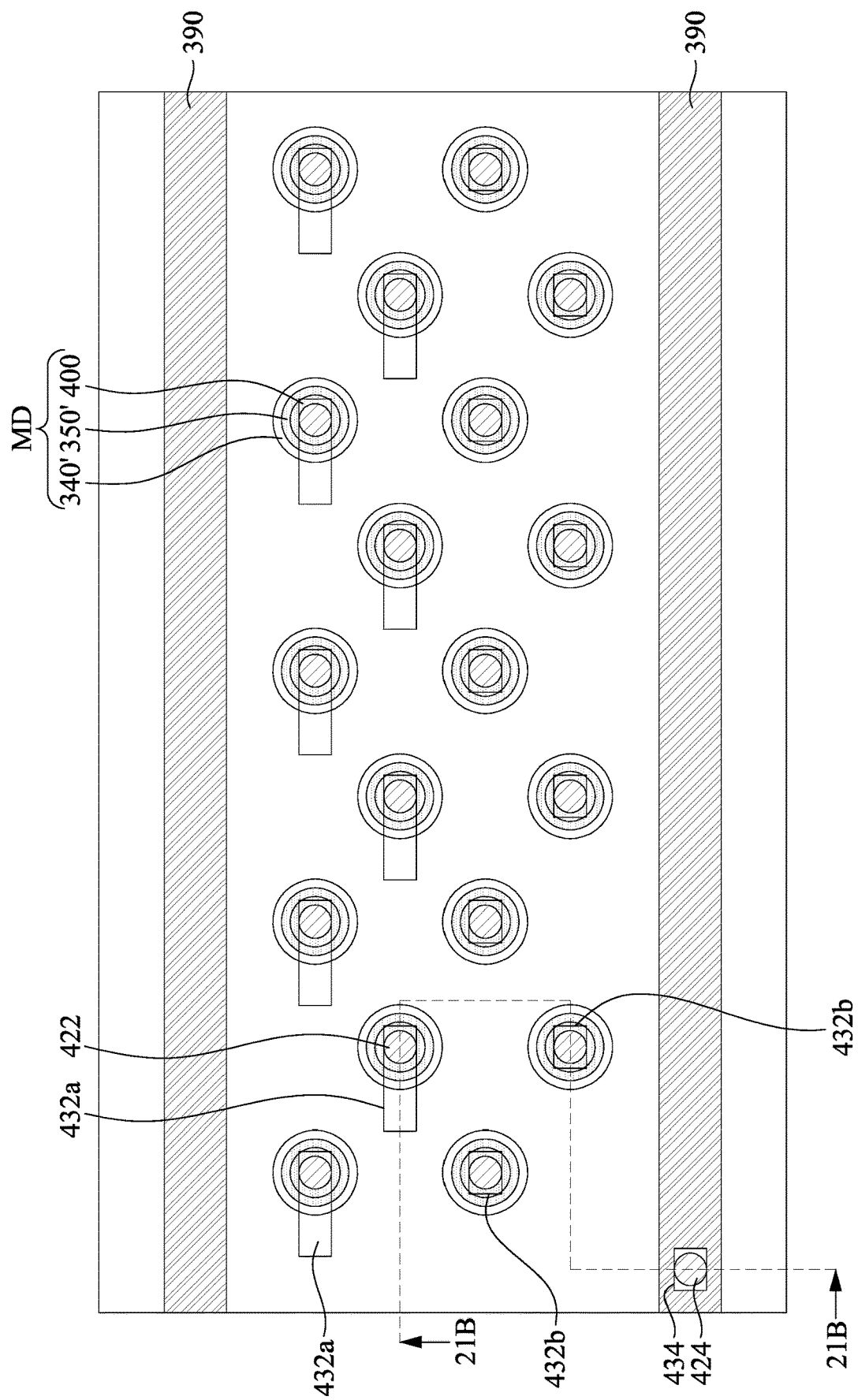
Figure 21B:
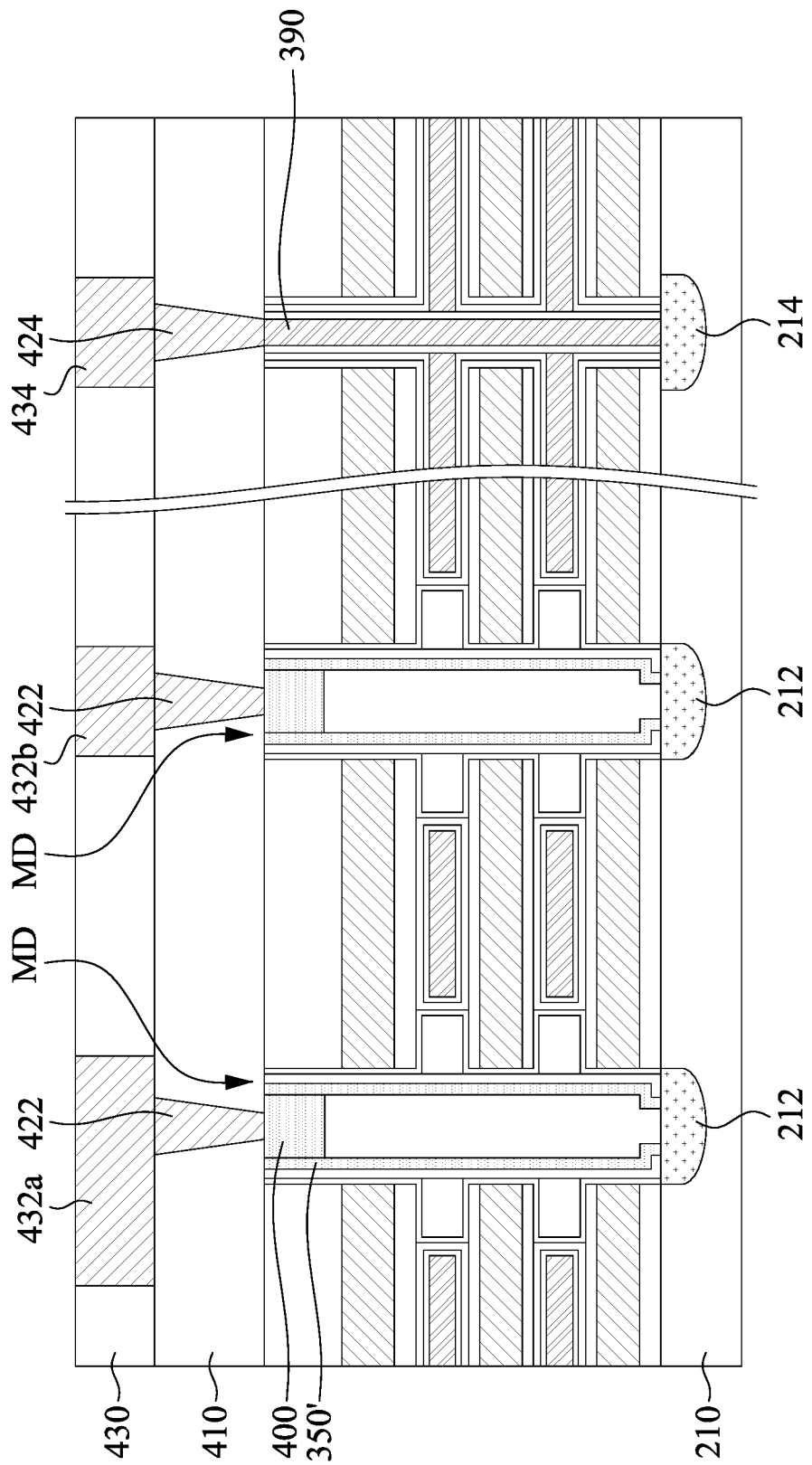

Referring to FIGS. 21A and 21B, FIG. 21B is a cross-sectional view taken along line 21B-21B of FIG. 21A. A dielectric layer 430 is deposited over the structure of FIG. 20, and then metal lines 432a, 432b and 434 are formed in the dielectric layer 430 to respectively connect the contacts 422 and 424. Through the contacts 422, the metal lines 432a and 432b may be electrically connected to the semiconductor layer 350'. In the present embodiments, the metal lines 432a extends farther than the metal lines 432a does in the second direction D2. The dielectric layer 430 may include a material the same as that of the dielectric layer 410. The dielectric layer 430 may be an extra low-k dielectric (ELK) layer, such as carbon doped silicon dioxide, may be an oxide, such as silicon oxide, and/or may be the like or a combination thereof. In some embodiments, the metal lines 432a, 432b and 434 may be copper, aluminum, tungsten, the like, and/or a combination thereof. Formation of the dielectric layer 430 and the metal lines 432a, 432b and 434 includes, for example, depositing the dielectric layer 430 using a spin-on process, etching trenches in the dielectric layer 430 to expose the contacts 422 and 424, filling the trenches with metals using a suitable deposition technique, and performing a planarization process (e.g. CMP) to remove excess metals outside the trenches while leaving metals in the trenches to serve as the metal lines 432a, 432b and 434.

Figure 22A:
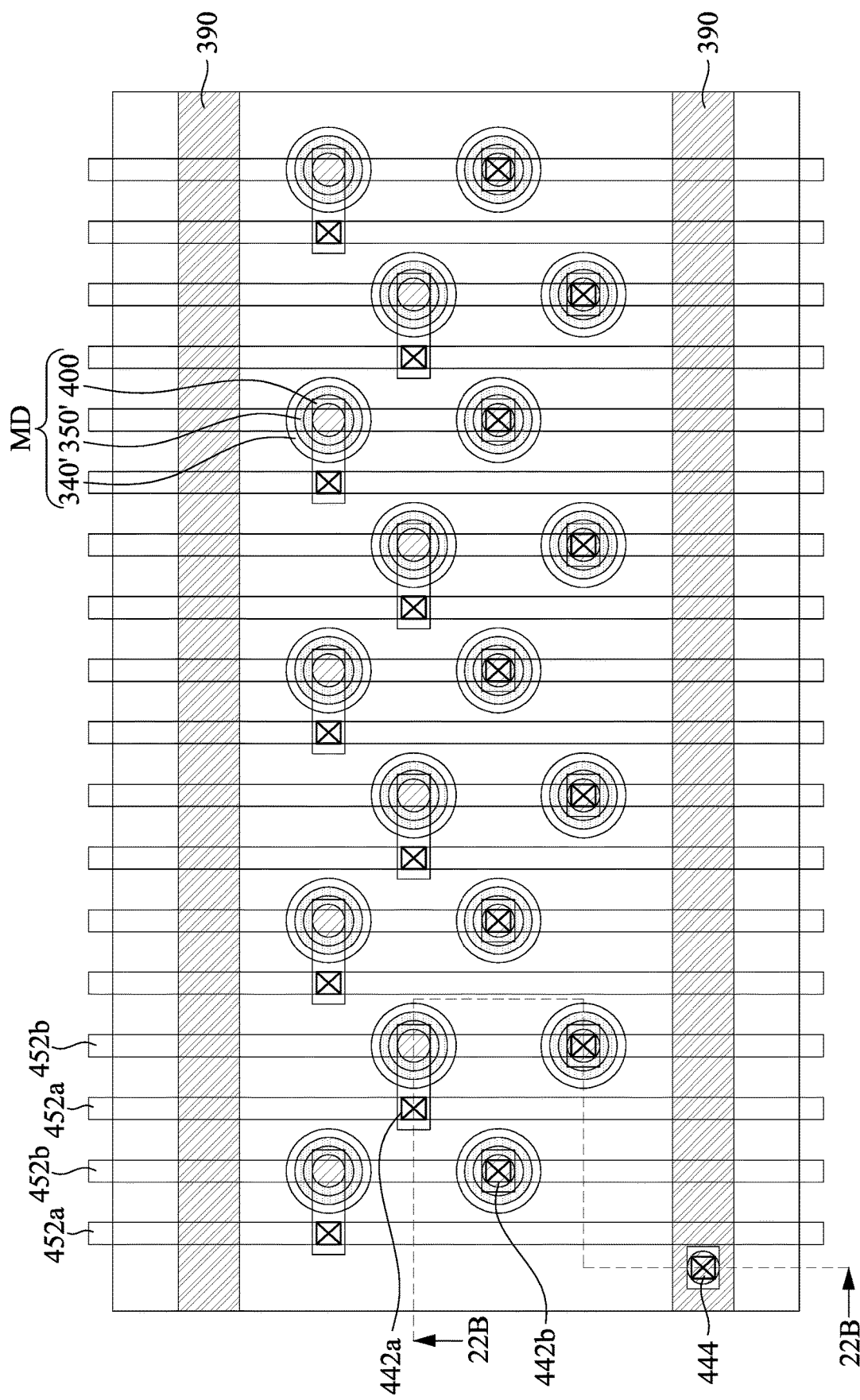
Figure 22B:
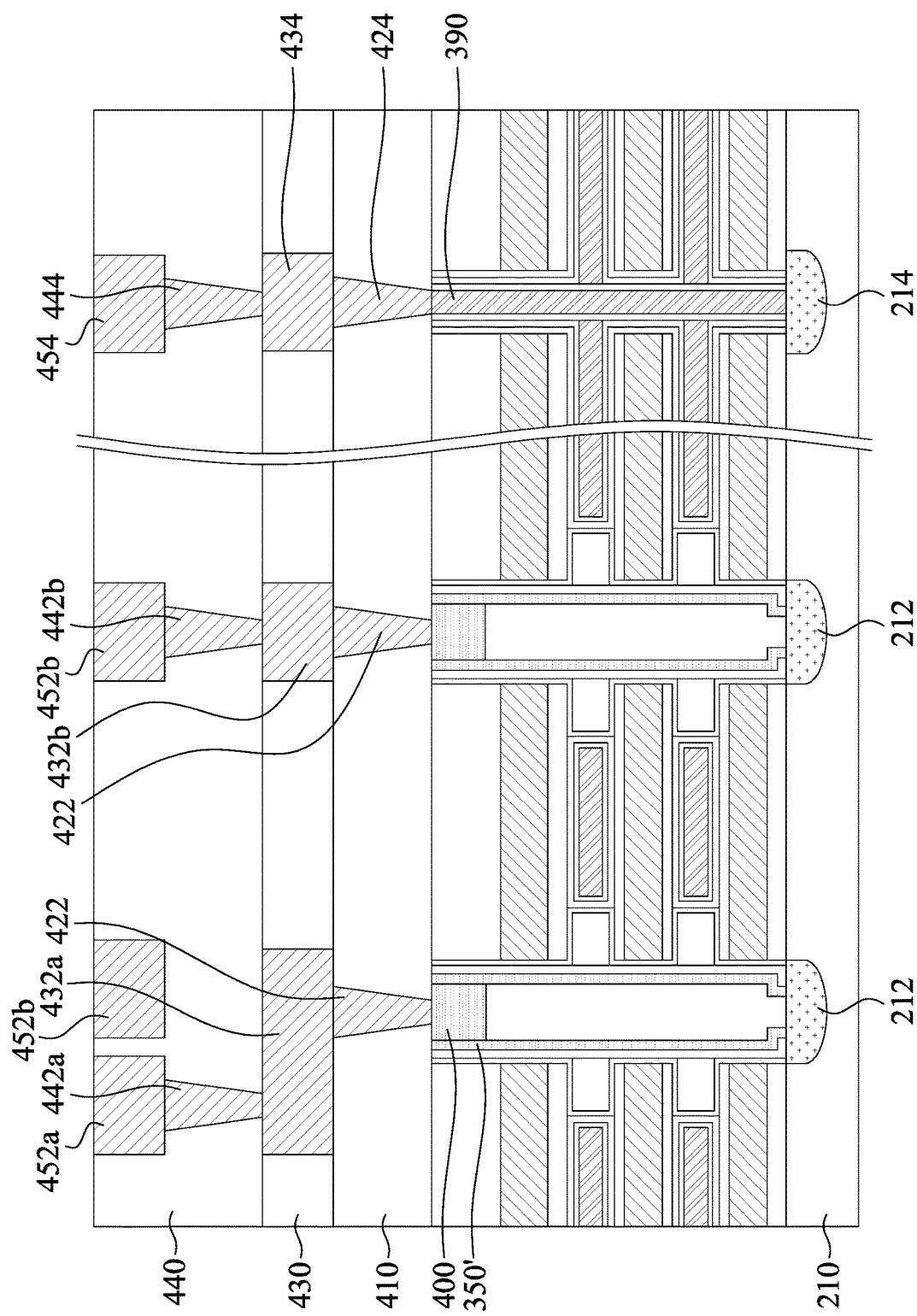

Referring to FIGS. 22A and 22B, FIG. 22B is a cross-sectional view taken along line 22B-22B of FIG. 22A. One or more dielectric layers 440 are deposited over the structure of FIGS. 21A and 21B, and metal vias 442a, 442b, and 444 and metal lines 452a, 452b, and 454 are formed in the dielectric layer 440. The metal vias 442a, 442b, and 444 may be connected between the metal lines 452a, 452b, and 454 and the metal lines 432a, 432b and 434, respectively. For better illustration, some metal lines 452a 452b are omitted in FIG. 22B.

In the present embodiments, since the metal lines 432a extend farther than the metal lines 432a does in the second direction D2, the metal vias 442a and 442b may be alternatively arranged along the second direction D2. Through the arrangement, the memory stack structures MD between two adjacent source contact features 390 may be respectively connected to different metal lines (e.g., the metal lines 452a and 452b), which extend substantially along the first direction D1. For example, in the present embodiments, the metal lines 432a may extend from a top of the conductive feature 400 toward a position away from the conductive feature 400 as viewed from top, while the metal lines 432b may be substantially aligned with respect to the conductive feature 400 as viewed from top. Therefore, the metal vias 442a landing on the metal lines 432a may be deviated from the conductive feature 400 as viewed from top, while the metal vias 442b landing on the metal lines 432b may be substantially aligned with respect to the conductive feature 400 as viewed from top. Through the configuration, the metal lines 452a and 452b respectively connected to the metal vias 442a and 442b can extends along the first direction and be alternatively arranged along the second direction D2. In some embodiments, the metal lines 452a and 452b may be referred to as bit lines (e.g., the bit lines BL0-BL1 in FIGS. 1A-1C), and the metal line 454 may be referred to as a source line (e.g., the source line SL in FIGS. 1A-1C). The metal lines 432a, 432b and 434 formed in the dielectric layer 430 and the metal vias 442a, 442b, and 444 and metal lines 452a, 452b, and 454 formed in the dielectric layer 440 may be a portion of BEOL electrical interconnect.

Figure 23:
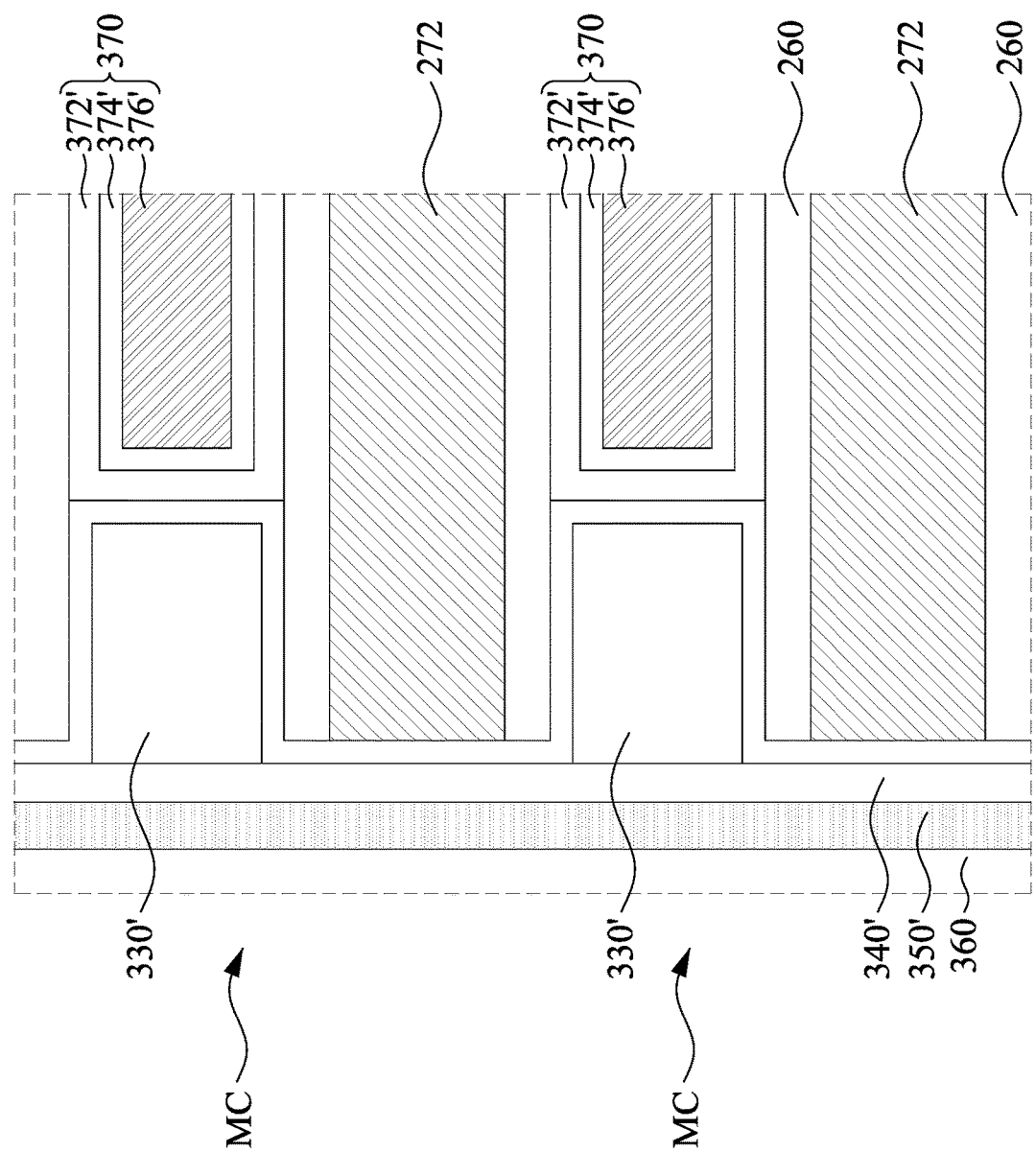
FIG. 23 is a schematic cross-sectional view of a semiconductor device according to some embodiments of the present disclosure.

FIG. 23 is a schematic cross-sectional view of a semiconductor device according to some embodiments of the present disclosure. As aforementioned, memory stack structures MD may include plural memory cells MC and plural erase gate electrodes 272 between adjacent two memory cells MC. Other details of the present embodiments are similar to those aforementioned, and therefore not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that an erase gate is disposed between two adjacent memory cells in a memory string, such that charges stored in the floating gate may be erase through the path from the floating gate to the erase gate, thereby improving reliability and endurance. Furthermore, voltages used during the programming and erase operations may be reduced by the configuration of the erase gate. Another advantage is that the erase gate may invert channel and thereby enlarge the read current detected in the reading operation. Still advantage is that the configuration of the erase gate may shield adjacent floating gates, thereby reducing the interference between adjacent floating gate. Still advantage is that some metal lines between the bit line and the memory strings may extend farther than some other metal lines between the bit line and the memory strings in first direction, such that the bit lines may be arranged in an equal-distance manner along a second direction orthogonal to the first direction.

According to some embodiments of the present disclosure, a method for fabricating a semiconductor device is provided. The method includes depositing a first dielectric layer over a substrate; depositing a sacrificial layer over the first dielectric layer; depositing a second dielectric layer over the sacrificial layer; depositing an erase gate electrode layer over the second dielectric layer; etching a memory hole in the erase gate electrode layer, the sacrificial layer, and the first and second dielectric layers; and forming a semiconductor layer in the memory hole.

According to some embodiments of the present disclosure, a method for fabricating a semiconductor device is provided. The method includes depositing a first dielectric layer over a substrate; depositing a select gate electrode layer over the first dielectric layer; depositing a second dielectric layer over the select gate electrode layer; depositing a sacrificial layer over the first dielectric layer; depositing a third dielectric layer over the sacrificial layer; forming a semiconductor layer extending upward from a top surface of the substrate through the select gate electrode layer, the sacrificial layer, and the first to third dielectric layers; and replacing a first portion of the sacrificial layer with a control gate electrode.

According to some embodiments of the present disclosure, a semiconductor device includes a semiconductor substrate, a first semiconductor layer, a first floating gate electrode, a first control gate electrode, and an erase gate electrode. The semiconductor substrate has a first source/drain region. The first semiconductor layer extends upward from the first source/drain region of the semiconductor substrate. The first floating gate electrode surrounds a first portion of the first semiconductor layer. The first control gate electrode surrounds the first floating gate electrode and the first portion of the first semiconductor layer. The erase gate electrode is over the first floating gate electrode and the first control gate electrode, in which the erase gate electrode surrounds a second portion of the first semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
   depositing a first dielectric layer over a substrate;
   depositing a sacrificial layer over the first dielectric layer;
   depositing a second dielectric layer over the sacrificial layer;
   depositing an erase gate electrode layer over the second dielectric layer;
   etching a memory hole in the erase gate electrode layer, the sacrificial layer, and the first and second dielectric layers;
   etching a first portion of the sacrificial layer adjacent to the memory hole to form a first recess between the first and second dielectric layers, wherein the erase gate electrode layer has a higher etch resistance to etching the first portion of the sacrificial layer than that of the sacrificial layer;
   forming a floating gate electrode in the first recess; and
   forming a semiconductor layer in the memory hole.

2. The method of claim 1, further comprising:
   etching a trench opening in the erase gate electrode layer, the sacrificial layer, and the first and second dielectric layers; and
   forming a conductive feature in the trench opening.

3. The method of claim 2, further comprising:
   removing a second portion of the sacrificial layer adjacent to the trench opening, thereby forming a second recess between the first and second dielectric layers; and
   forming a control gate electrode in the second recess.

4. The method of claim 3, wherein removing the second portion of the sacrificial layer comprises etching the second portion of the sacrificial layer, wherein the erase gate electrode layer has a higher etch resistance to etching the second portion of the sacrificial layer than that of the sacrificial layer.

5. The method of claim 2, wherein etching the trench opening is performed such that the erase gate electrode layer is cut into a first erase gate electrode and a second erase gate electrode spaced apart from the first erase gate electrode by the trench opening.

6. The method of claim 1, further comprising:
etching an opening in the semiconductor layer; and
forming a dielectric core in the memory hole and the opening.

7. A method for fabricating a semiconductor device, comprising:
depositing a first dielectric layer over a substrate;
depositing a select gate electrode layer over the first dielectric layer;
depositing a second dielectric layer over the select gate electrode layer;
depositing a sacrificial layer over the second dielectric layer;
depositing a third dielectric layer over the sacrificial layer;
forming a semiconductor layer extending upward from a top surface of the substrate through the select gate electrode layer, the sacrificial layer, and the first to third dielectric layers; and
after forming the semiconductor layer, replacing a first portion of the sacrificial layer with a control gate electrode.

8. The method of claim 7, wherein replacing the first portion of the sacrificial layer with the control gate electrode comprises etching the first portion of the sacrificial layer, wherein the select gate electrode layer has a higher etch resistance to etching the first portion of the sacrificial layer than that of the sacrificial layer.

9. The method of claim 7, further comprising:
patterning the select gate electrode layer into a plurality of select gate electrodes prior to replacing the first portion of the sacrificial layer with the control gate electrode.

10. The method of claim 7, further comprising:
replacing a second portion of the sacrificial layer with a floating gate electrode prior to forming the semiconductor layer.

11. The method of claim 7, wherein depositing the sacrificial layer is performed such that the sacrificial layer comprises a material different from that of the first dielectric layer, the select gate electrode layer, and the second dielectric layer.

12. A method for fabricating a semiconductor device, comprising:
depositing a memory stack layer over a substrate, wherein the memory stack layer comprises a select gate electrode layer, a first dielectric layer over the select gate electrode layer, a sacrificial layer over the first dielectric layer, and a second dielectric layer over the sacrificial layer;
etching a memory hole in the memory stack layer;
removing a first portion of the sacrificial layer to form a recess adjacent to the memory hole and between the first and second dielectric layers, wherein the recess exposes a portion of a top surface of the first dielectric layer and a sidewall of a second portion of the sacrificial layer remaining over the first dielectric layer;
depositing a blocking layer having a first portion extending along the exposed portion of the top surface of the first dielectric layer and a second portion extending along the exposed sidewall of the second portion of the sacrificial layer;
forming a floating gate electrode in the recess;
depositing a tunneling layer in the memory hole, wherein the tunneling layer has a first portion in contact with a sidewall of the floating gate electrode; and
forming a semiconductor layer in the memory hole.

13. The method of claim 12, wherein removing the first portion of the sacrificial layer is performed such that the recess further exposes a portion of a bottom surface of the second dielectric layer, and depositing the blocking layer is performed such that the blocking layer further has a third portion extending along the exposed portion of the bottom surface of the second dielectric layer.

14. The method of claim 12, wherein depositing the blocking layer is performed such that the blocking layer further has a third portion extending along a sidewall of the select gate electrode layer.

15. The method of claim 14, wherein depositing the tunneling layer is performed such that the tunneling layer has a second portion in contact with the third portion of the blocking layer.

16. The method of claim 12, wherein depositing the memory stack layer is performed such that the memory stack layer further comprises an erase gate electrode layer over the second dielectric layer.

17. The method of claim 16, wherein depositing the blocking layer is performed such that the blocking layer further has a third portion extending along a sidewall of the erase gate electrode layer.

18. The method of claim 1, wherein forming the semiconductor layer is performed such that the semiconductor layer is in contact with the substrate.

19. The method of claim 5, wherein forming the conductive feature is performed such that the conductive feature is between the first erase gate electrode and the second erase gate electrode.

20. The method of claim 7, further comprises:
forming a source/drain region in the substrate, wherein the semiconductor layer is in contact with the source/drain region.

* * * * *